United States Patent
Kondou et al.

(10) Patent No.: US 9,337,732 B2
(45) Date of Patent: *May 10, 2016

(54) CHARGE AND DISCHARGE SIGNAL CIRCUIT AND DC-DC CONVERTER

(71) Applicants: FUJITSU LIMITED, Kawasaki-shi, Kanagawa (JP); FUJITSU SEMICONDUCTOR LIMITED, Yokohama-shi, Kanagawa (JP)

(72) Inventors: Masafumi Kondou, Kawasaki (JP); Koji Takekawa, Kawasaki (JP)

(73) Assignees: FUJITSU LIMITED, Kawasaki (JP); FUJITSU SEMICONDUCTOR LIMITED, Yokohama (JP)

( * ) Notice: Subject to any disclaimer, the term of this patent is extended or adjusted under 35 U.S.C. 154(b) by 132 days.

This patent is subject to a terminal disclaimer.

(21) Appl. No.: 14/229,751

(22) Filed: Mar. 28, 2014

(65) Prior Publication Data
US 2014/0306674 A1    Oct. 16, 2014

(30) Foreign Application Priority Data
Apr. 10, 2013    (JP) ................................. 2013-082205

(51) Int. Cl.
*G05F 1/00*    (2006.01)
*H02M 3/158*    (2006.01)
*H03K 17/10*    (2006.01)

(52) U.S. Cl.
CPC ............. *H02M 3/158* (2013.01); *H03K 17/102* (2013.01); *H03K 2217/0063* (2013.01); *H03K 2217/0081* (2013.01)

(58) Field of Classification Search
CPC ... H02M 3/156; H02M 3/158; H02M 3/1582; H02M 3/1584; H02M 3/00; H02M 3/07; H02M 3/06; H02M 2001/0029; H02M 2001/0041; H02M 2001/0058; H02M 2001/0077; H02M 2001/008; H02M 2003/1586; H03K 17/10; H03K 17/102; H03K 2217/0063; H03K 2217/0081
USPC ......... 323/212, 217, 234, 271, 282–285, 901, 323/268, 311, 299, 312; 327/333, 108, 110, 327/436, 381
See application file for complete search history.

(56) References Cited

U.S. PATENT DOCUMENTS

| | | | |
|---|---|---|---|
| 5,616,945 A | 4/1997 | Williams | |
| 7,595,613 B2 * | 9/2009 | Thompson | G05F 1/613 323/223 |

(Continued)

FOREIGN PATENT DOCUMENTS

| | | | | |
|---|---|---|---|---|
| DE | 102006037336 B3 * | 2/2008 | ......... | H03K 17/0814 |
| JP | 09-223799 A | 8/1997 | | |
| JP | 2001-061271 A | 3/2001 | | |

OTHER PUBLICATIONS

Kuttner, et al., "A Digitally Controlled DC-DC Converter for SoC in 28m CMOS," ISSCC 2011, Session 22, DC/DC Converters, 22.2, pp. 384-408.

(Continued)

*Primary Examiner* — Timothy J Dole
*Assistant Examiner* — Shahzeb K Ahmad
(74) *Attorney, Agent, or Firm* — Arent Fox LLP

(57) ABSTRACT

A charge and discharge signal circuit includes: high side transistors connected in series; low side transistors connected in series; high side drive circuits; low side drive circuits; and a drive signal generation circuit, wherein each drive circuit includes: a high side level shifter; a high side capacitor switch string of a capacitor and a switch element connected in series, being connected in parallel with the high side transistor; and a high side drive part, to which an output of the high side level shifter is supplied, and each of the low side drive circuits includes: a low side level shifter; a low side capacitor switch string of a capacitor and a switch element connected in series, being connected in parallel with the low side transistor; and a low side drive part, to which an output of the low side level shifter is supplied.

17 Claims, 16 Drawing Sheets

(56) References Cited

U.S. PATENT DOCUMENTS

| | | | | |
|---|---|---|---|---|
| 8,018,255 B2* | 9/2011 | Hirao | .................... | H02M 3/158 257/288 |
| 8,212,536 B2* | 7/2012 | Burns | .................. | H03K 17/102 323/224 |
| 8,952,670 B2* | 2/2015 | Huang | .................. | H02M 3/158 323/276 |
| 2007/0159150 A1* | 7/2007 | Hosokawa | .......... | H02M 3/1588 323/285 |
| 2010/0271102 A1* | 10/2010 | Azetsuji | ........... | H03K 19/00361 327/306 |
| 2011/0187340 A1* | 8/2011 | Deval | .................... | H02M 3/158 323/285 |
| 2013/0002149 A1* | 1/2013 | Mott | ..................... | H02M 1/088 315/161 |
| 2013/0200938 A1* | 8/2013 | Yao | ................ | H03K 19/017527 327/365 |
| 2015/0123640 A1* | 5/2015 | Kondou | ............... | H03K 17/102 323/299 |

OTHER PUBLICATIONS

Xiao, et al., "A 4μA-Quiescent-Current Dual-Mode Buck Converter IC for Cellular Phone Applications," ISSCC 2004, Session 15, Wireless Consumer ICs, 15.7, pp. 1-24.

* cited by examiner

CHARGE AND DISCHARGE SIGNAL CIRCUIT AND DC-DC CONVERTER

CROSS-REFERENCE TO RELATED APPLICATION

This application is based upon and claims the benefit of priority of the prior Japanese Patent Application No. 2013-082205, filed on Apr. 10, 2013, the entire contents of which are incorporated herein by reference.

FIELD

The technique disclosed herein relates to a change and discharge signal circuit and a DC-DC converter.

BACKGROUND

When forming a DC-DC converter, in general, an inductor is attached to a power source IC which has been supplied as an external part. In recent years, downsizing of a power source circuit is also demanded and it is desired to accommodate the inductor within the power source IC. In order to accommodate the inductor within the power source IC, the inductor is downsized, however, if the inductor is downsized, the value of inductance is also reduced. If the inductance value of the inductor and the capacitance value are reduced, the output voltage ripple (noise) increases. In order to reduce the inductance value and the capacitance value while satisfying the specifications on the output voltage ripple (noise) of the DC-DC converter, the switching frequency is raised (increased). However, if the switching frequency is raised, then an electric power loss accompanying the charge and discharge operation of the capacitor increases and efficiency is reduced.

As described above, in the DC-DC converter, coexistence of high efficiency and downsizing creates a technical problem.

It is known to reduce the electric power loss accompanying switching to 1/S by vertically stacking transistors scaled (downsized) with a scaling factor S in S stages. However, if multiple output stages are stacked, then the capacitance value of the bias capacitor increases in order to suppress fluctuations of the bias voltage and it is also difficult to implement a vertical stack of three or more stages because of difficulty in designing the driver circuit.

RELATED DOCUMENTS

[Patent Document 1] Japanese Laid Open Patent Document No. 2001-061271
[Patent Document 2] Japanese Laid Open Patent Document No. H09-223799
[Non Patent Document 1] Franz Kultner, et al., "A Digitally Controlled DC-DC Converter for SoC in 28 nm CMOS" ISSCC Dig. Tech. Papers, pp. 384-385, February 2011
[Non Patent Document 2] Jinwen Xiao, et al., "A 4uA-Quiescent-Current Dual-Mode Buck Converter IC for Cellular Phone Applications" ISSCC Dig. Tech. Papers, pp. 384-385, February 2004

SUMMARY

A charge and discharge signal circuit according to a first aspect of the embodiments, includes: a plurality of high side transistors connected in series between a high potential side power source and an output node; a plurality of low side transistors connected in series between a low potential side power source and the output node; a plurality of high side drive circuits provided respectively in correspondence to the plurality of high side transistors; a plurality of low side drive circuits provided respectively in correspondence to the plurality of low side transistors; and a drive signal generation circuit configured to output a drive signal, wherein each of the high side drive circuits includes: a high side level shifter configured to convert a level of the drive signal; a high side capacitor switch string of a capacitor and a switch element connected in series, being connected in parallel with the high side transistor; and a high side drive part connected between a source of the high side transistor and a connection node of the capacitor and the switch element of the high side capacitor switch string, to which an output of the high side level shifter is supplied, and which outputs a drive signal to the high side transistor, and each of the low side drive circuits includes: a low side level shifter configured to convert a level of the drive signal; a low side capacitor switch string of a capacitor and a switch element connected in series, being connected in parallel with the low side transistor; and a low side drive part connected between a source of the low side transistor and a connection node of the capacitor and the switch element of the low side capacitor switch string, to which an output of the low side level shifter is supplied, and which outputs a drive signal to the low side transistor.

A DC-DC converter according to a second aspect of the embodiments, includes: a capacitor one terminal of which is connected to a ground; an inductor one terminal of which is connected to the other terminal of the capacitor; and a charge and discharge signal circuit configured to output an alternating-current signal to be applied to the other terminal of the inductor, wherein the charge and discharge signal circuit includes: a plurality of high side transistors connected in series between a high potential side power source and an output node; a plurality of low side transistors connected in series between a low potential side power source and the output node; a plurality of high side drive circuits provided respectively in correspondence to the plurality of high side transistors; a plurality of low side drive circuits provided respectively in correspondence to the plurality of low side transistors; and a drive signal generation circuit configured to output a drive signal, wherein each of the high side drive circuits includes: a high side level shifter configured to convert a level of the drive signal; a high side capacitor switch string of a capacitor and a switch element connected in series, being connected in parallel with the high side transistor; and a high side drive part connected between a source of the high side transistor and a connection node of the capacitor and the switch element of the high side capacitor switch string, to which an output of the high side level shifter is supplied, and which outputs a drive signal to the high side transistor, and each of the low side drive circuits includes: a low side level shifter configured to convert a level of the drive signal; a low side capacitor switch string of a capacitor and a switch element connected in series, being connected in parallel with the low side transistor; and a low side drive part connected between a source of the low side transistor and a connection node of the capacitor and the switch element of the low side capacitor switch string, to which an output of the low side level shifter is supplied, and which outputs a drive signal to the low side transistor.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 9A illustrates the case where Vdd=15 V is output to the output node LX and FIG. 9B illustrates the case where GND=0 V is output to the output node LX;

DESCRIPTION OF EMBODIMENTS

Before describing embodiments, a DC-DC converter and a charge and discharge signal circuit used therein will be is explained.

Figure 1:
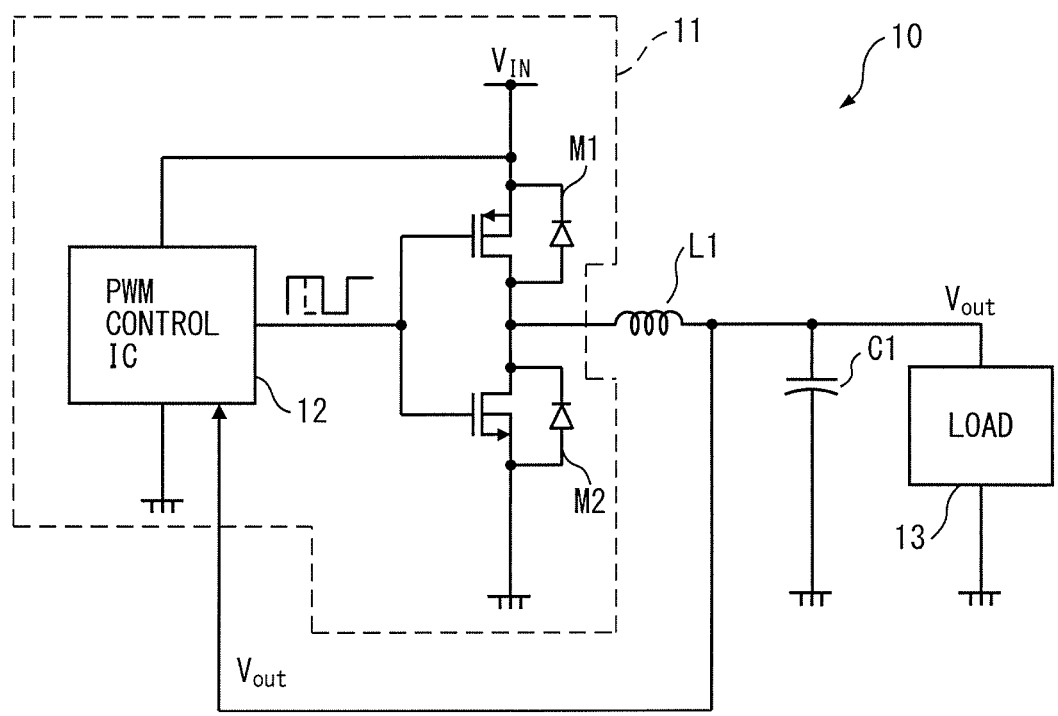
FIG. 1 is a diagram illustrating a schematic configuration of a DC-DC converter.

FIG. 1 is a diagram illustrating an outline configuration of a DC-DC converter 10.

The DC-DC converter 10 has a charge and discharge signal circuit 11 configured to output an alternating-current signal, an inductor L1, and a capacitor C1. One terminal of C1 is grounded and the other terminal is connected to one terminal of L1. The other terminal of L1 is connected to the output node of the charge and discharge signal circuit 11. From the connection node of L1 and C1, a converted DC output voltage Vout is output and applied to a load 13.

The charge and discharge signal circuit 11 has a PWM control IC 12 and a PMOS transistor M1 and an NMOS transistor M2 connected in series between a high potential side power source Vin and GND. The PWM control IC 12 generates a drive signal that changes between high (H) and low (L) to change the duty ratio of the drive signal in accordance with Vout. The PMOS transistor M1 and the NMOS transistor M2 turn on/off in accordance with the drive signal. When M1 is on and M2 is off, an electric current is caused to flow from Vin to the output node, i.e., to the terminal of L1 and when M1 is off and M2 is on, an electric current is drawn to GND from the terminal of L1.

The DC-DC converter in FIG. 1 is widely known, and therefore, further explanation is omitted.

As illustrated in FIG. 1, in order to carry out DC-DC conversion with high efficiency, the inductor L1 is used.

Figure 2A:
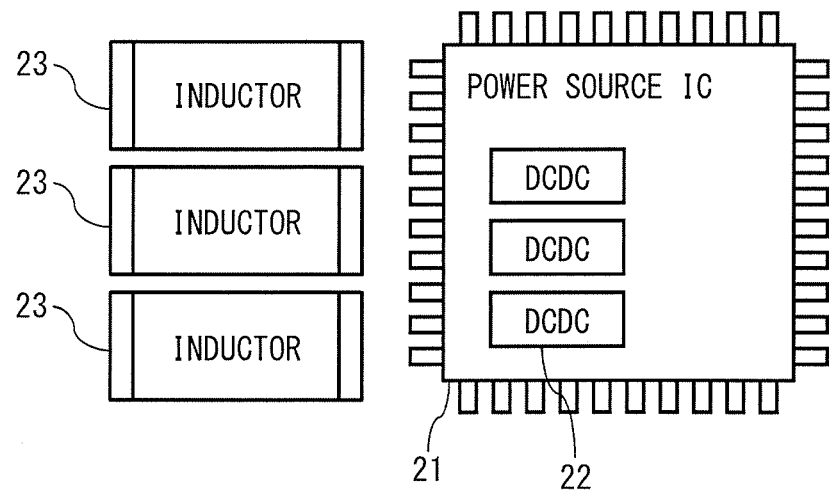
FIG. 2A and FIG. 2B are diagrams each illustrating a configuration example in the case where the DC-DC converter is formed by attaching an inductor to the power source IC.
Figure 2B:
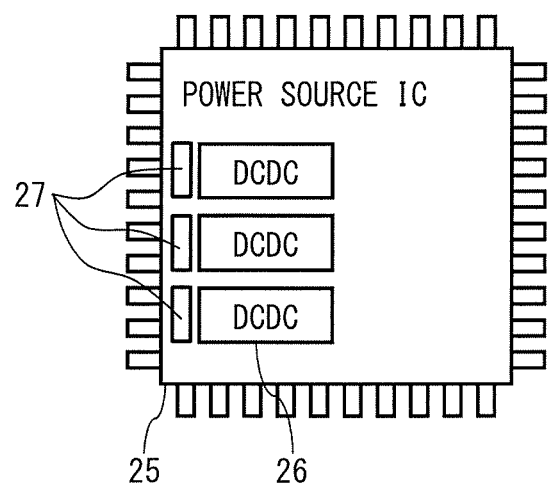

FIG. 2A and FIG. 2B are diagrams each illustrating a configuration example in the case where the DC-DC converter is formed by attaching an inductor to the power source IC.

Until this time, the inductor has been supplied generally in the form of a discrete (individual) part and has a size to a certain degree. Because of this, as illustrated in FIG. 2A, on a printed substrate, etc., mounting a power source IC 21 internally having charge and discharge signal circuits 22 for DC-DC conversion, inductors 23, which are discrete parts, are mounted and they are wired on the substrate and thus the DC-DC converter is formed. In other words, the inductor is an external part.

In recent years, downsizing of the power source circuit is also demanded and it is desired to accommodate the inductor within the power source IC. As illustrated in FIG. 2B, in order to accommodate the inductor within the power source IC, the inductor is downsized, however, if the inductor is downsized, the value of inductance is reduced. If the inductance value of the inductor and the capacitance value are reduced, the output voltage ripple (noise) increases. In order to reduce the inductance value and the capacitance value while satisfying the specifications on the output voltage ripple (noise) of the DC-DC converter, the switching frequency is raised (increased). However, if the switching frequency is raised, then an electric power loss accompanying the charge and discharge operation of the capacitor increases and efficiency is reduced.

As described above, in the DC/DC converter, coexistence of high efficiency and downsizing creates a technical problem.

It is known to reduce the electric power loss accompanying switching to 1/S by vertically stacking scaled transistors (downsized) with the scaling factor S in S stages.

Figure 3A:
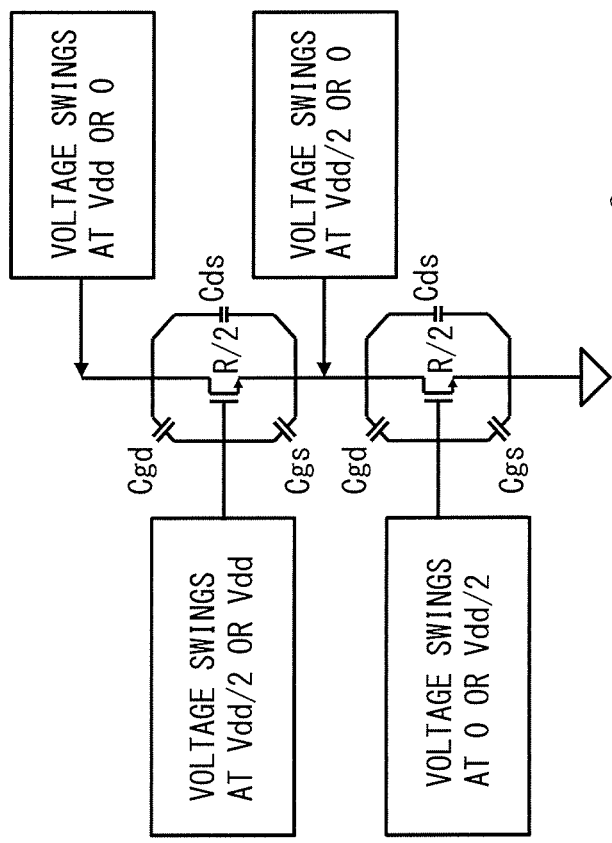
FIG. 3A and FIG. 3B are diagrams each explaining an electric loss accompanying switching in the case where scaling (downsizing) is performed with S=1 and 2.
Figure 3B:
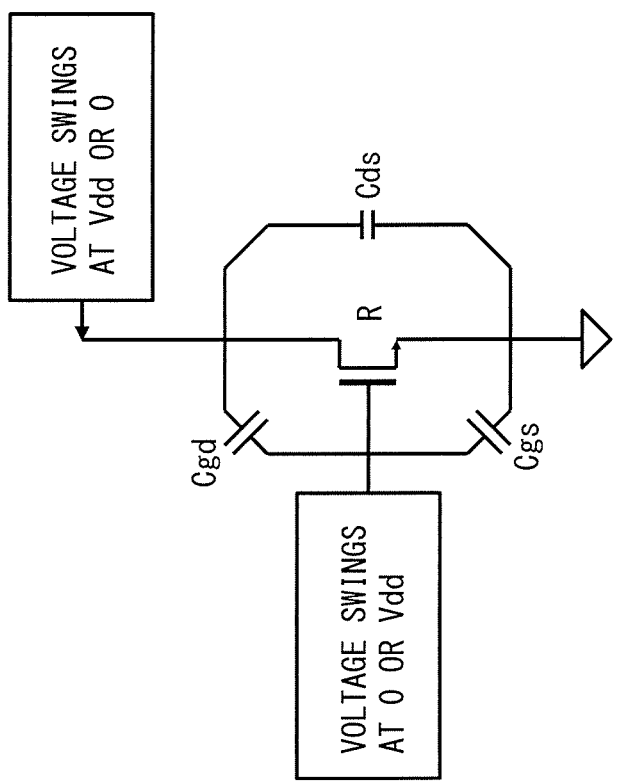

FIG. 3A and FIG. 3B are diagrams each explaining an electric loss accompanying switching in the case where scaling (downsizing) is performed with S=1 and 2.

A case is considered, where in the (NMOS) transistor in one stage before scaling with S=1, the source is grounded and the gate and the drain are swung between Vdd and 0 V as illustrated in FIG. 3A. Here, the on-resistance of the transistor is denoted by R, the gate-to-source capacitance by $C_{gs}$, the gate-to-drain capacitance by $C_{gd}$, the drain-to-source capacitance by $C_{ds}$, the gate-to-source voltage by $V_{gs}$, the gate-to-drain voltage by $V_{ds}$, and the switching frequency by $f_{sw}$. The switching loss is expressed as below.

$$(C_{gs}+C_{gd})V_{gs}^2 f_{sw}+(C_{gd}+C_{ds})V_{ds}^2 f_{sw}=(C_{gs}+2C_{gd}+C_{ds})V_{dd}^2 f_{sw}$$

As illustrated in FIG. 3B, two (NMOS) transistors scaled with S=2 in two stages are stacked vertically, the source of the transistor on the lower side is grounded, and the drain of the transistor on the upper side is swung between Vdd and 0 V. Further, the gate of the lower transistor is swung between Vdd/2 and 0 V, the gate of the upper transistor is swung between Vdd and Vdd/2, and then the connection node of the two transistor swings between Vdd/2 and 0 V.

Accompanying the scaling, the dimensions (width, length, etc.) of the transistor is reduced to 1/S, the doping density of the substrate is increased to S times, the voltage is reduced to 1/S, and the current per device is reduced to 1/S. Due to this, a gate capacitance Cg is reduced to 1/S and the on-resistance of the transistor is kept at 1 (remains the same). However, in the case where the cascode connection is supposed as in FIG. 3B, the width of the transistor is increased to S times in order to make the same the condition of the on-resistance after vertical stacking, i.e., to reduce the on-resistance of the upper and lower transistors to R/S. As a result of that, Cg remains the same before and after the scaling. In FIG. 3B, S=2, and therefore, the on-resistance of the upper and lower transistors is reduced to R/2 and Cgs and Cgd have the same value.

In the case of FIG. 3B, the switching loss is expressed as below.

$$2(Cgs+2Cgd+Cds)(Vdd/2)^2 fsw = \frac{1}{2}*(Cgs+2Cgd+Cds)Vdd^2 fsw$$

As described above, by vertically stacking the scaled transistors (downsized) with the scaling factor S in S stages, the electric loss accompanying switching is reduced to 1/S.

Figure 4:
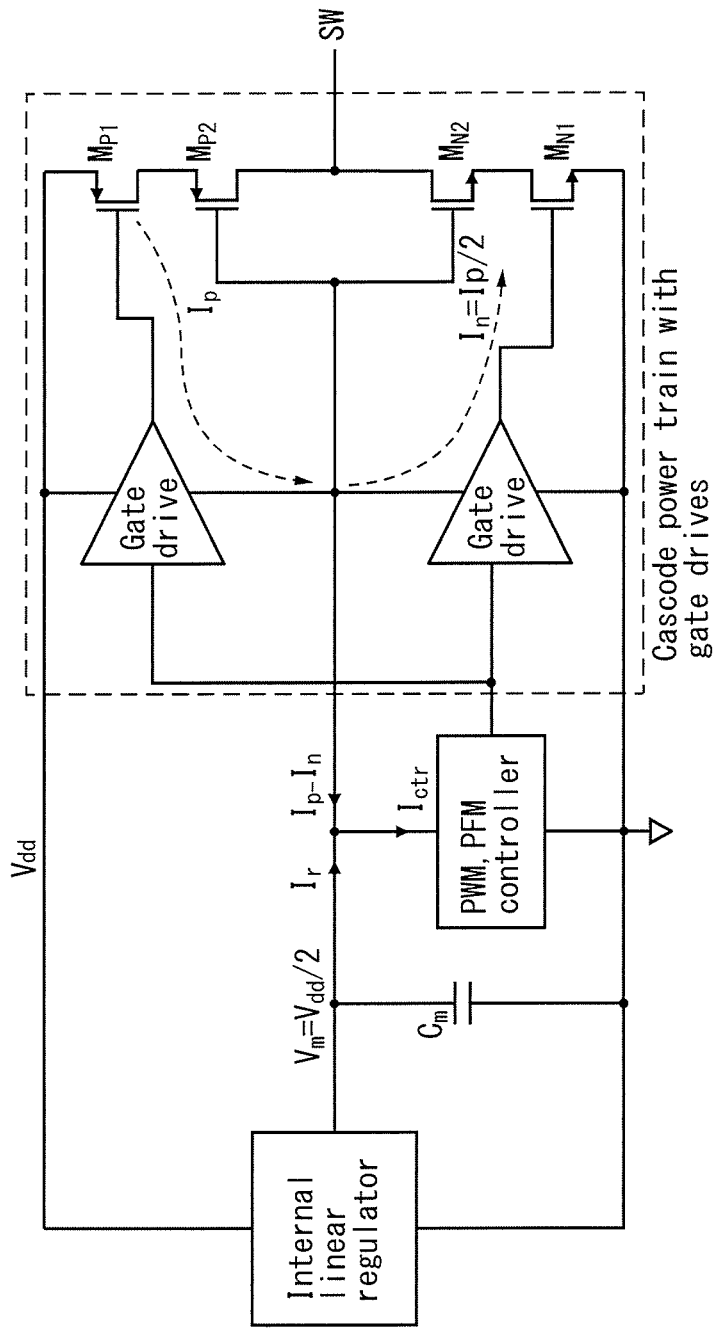
FIG. 4 is a diagram illustrating a configuration example of the DC-DC converter in which the output stages are stacked in two stages described in Non-patent Document 2.

FIG. 4 is a diagram illustrating a configuration example of the DC-DC converter in which the output stages are stacked in two stages described in Non-patent Document 2. Two PMOS transistors and two NMOS transistors are connected in series between the high potential side power source Vdd and GND and to the gates of the PMOS transistor and the NMOS transistor at the center, Vm=Vdd/2 is applied to keep both the transistors on at all times. Then, the drive signal is level-converted by a gate driver and applied to the gates of the PMOS transistor and the NMOS transistor on both sides. In the DC-DC converter in FIG. 4, miniaturization is performed with the scaling factor S=2, and the withstand voltage of each transistor becomes a value slightly greater than Vdd/2. The DC-DC converter in FIG. 4 is publicly known and more explanation is omitted.

The DC-DC converter in FIG. 4 has problems as below.

(1) The capacitance value of a bias capacitor Cm necessary to observe the withstand voltage condition of each transistor by sufficiently suppressing fluctuations in Vm is increased.

(2) Generation of the control signal becomes difficult and the design of the driver circuit becomes complicated, and therefore, it is difficult to implement a vertical stack of three or more stages.

Figure 5A:
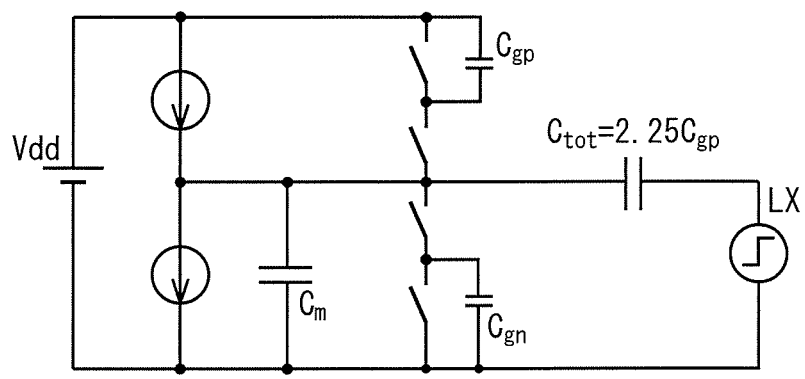
FIG. 5A and FIG. 5B are equivalent circuit diagrams each explaining the problem (1) that the capacitance value of the bias capacitor Cm increases.
Figure 5B:
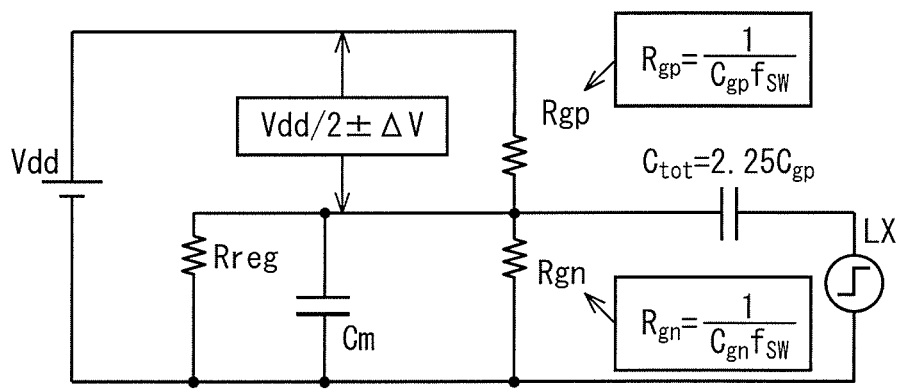

FIG. 5A and FIG. 5B are equivalent circuit diagrams each explaining the problem (1) that the capacitance value of the bias capacitor Cm increases.

As illustrated in FIG. 5A, if the capacitances between the gate and source and between the gate and drain of the PMOS transistor are taken to be 0.5*Cgp, respectively, the drive capacitance of one transistor becomes Cgp. Then, in the output stage of the DC-DC converter in FIG. 4, the two PMOS transistors and the two NMOS transistors are stacked vertically and by the whole of the output stage, the capacitor of Ctot=2.25 Cgp is driven as a result.

The circuit in FIG. 5A is equivalent to the circuit in FIG. 5B in which effective resistors Rgp and Rgn at the drive frequency of the two PMOS transistors and the two NMOS transistors are connected in series and Cm and Ctot are connected to the connection node thereof. In the circuit in FIG. 5B, a voltage fluctuation ΔV that occurs at the connection node of Rgp and Rgn when an output LX is swung between Vdd/2 and 0 V is expressed by an expression below.

$$\Delta V = 2.25 Cgp/(Cm+2.25 Cgp)*Vdd$$

If it is assumed that the amount of allowance of the voltage fluctuation is ΔV<Vdd/(10S), then, Cm>2.25 Vgp(10S−1) holds, and therefore, Cm having a capacitance value 20 to 30 times the gate capacitance of the switch in the output stage is necessary. Such a large capacitance is implemented by an external part.

Figure 6A:
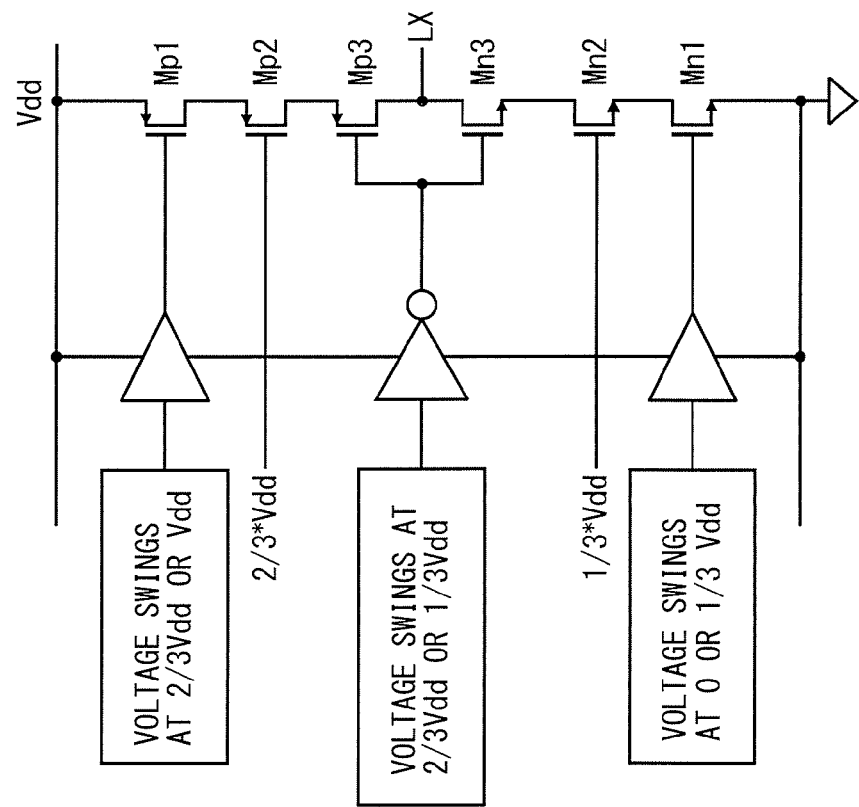
FIG. 6A and FIG. 6B are diagrams each explaining the problem (2) that it is difficult to implement a vertical stack of three or more stages.
Figure 6B:
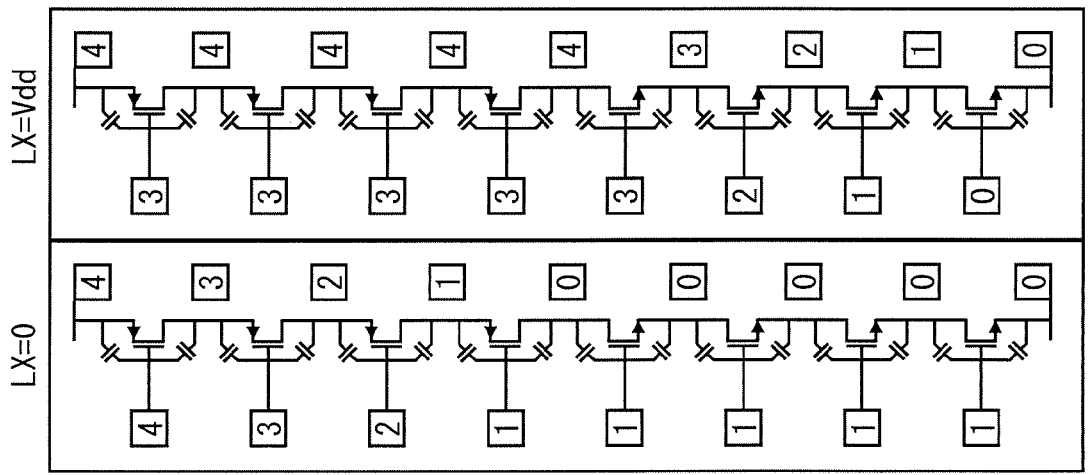

FIG. 6A and FIG. 6B are diagrams each explaining the problem (2) that it is difficult to implement a vertical stack of three or more stages.

FIG. 6A illustrates a charge and discharge signal circuit in which three PMOS transistors and three NMOS transistors are cascode-connected between Vdd and GND. To the gate of a first PMOS transistor Mp1, a drive signal that swings between 2Vdd/3 and Vdd is applied. To the gate of a second PMOS transistor Mp2, a fixed voltage of 2Vdd/3 is applied. To the gate of a first NMOS transistor Mn1, a drive signal that swings between 0 V and Vdd/3 is applied. To the gate of a second NMOS transistor Mn2, a fixed voltage of Vdd/3 is applied. To the gate of a third PMOS transistor Mp3 and to the gate of a third NMOS transistor Mn3, a drive signal that swings between 2Vdd/3 and Vdd/3 is applied after being inverted by an inverter. The restrictions of timing on logic inversion of the drive signal to be applied to the gates of the third PMOS transistor Mp3 and the third NMOS transistor Mn3 are strict and if the timing is too early or too late, then the Mp3 or Mn3 may be destroyed. By providing a timing difference between the three drive signals in view of variations, etc., in the manufacturing process, an attempt is made to observe the restrictions, however, there arises such a problem that the efficiency is reduced accordingly.

FIG. 6B is a diagram illustrating the voltage at each part in the case where output LX=0 and output LX=Vdd are assumed in a charge and discharge signal circuit in which four PMOS transistors and four NMOS transistors are cascode-connected between Vdd and GND. In FIG. 6B, "0" indicates 0 V, "1" Vdd/4, "2" Vdd/2, "3" 3Vdd/4, and "4" Vdd. It is difficult to observe the timing restrictions on the drive signal of each part in such a charge and discharge signal circuit with multiple stages and it is also difficult to implement a drive control circuit actually.

According to embodiments explained below, it is possible to implement a DC-DC converter in which multiple stages are stacked vertically (multistage cascode connection) without complicated restrictions on the design only by applying a capacitor whose capacitance is about two to three times that of the gate parasitic capacitor of each transistor for switching.

Figure 7:
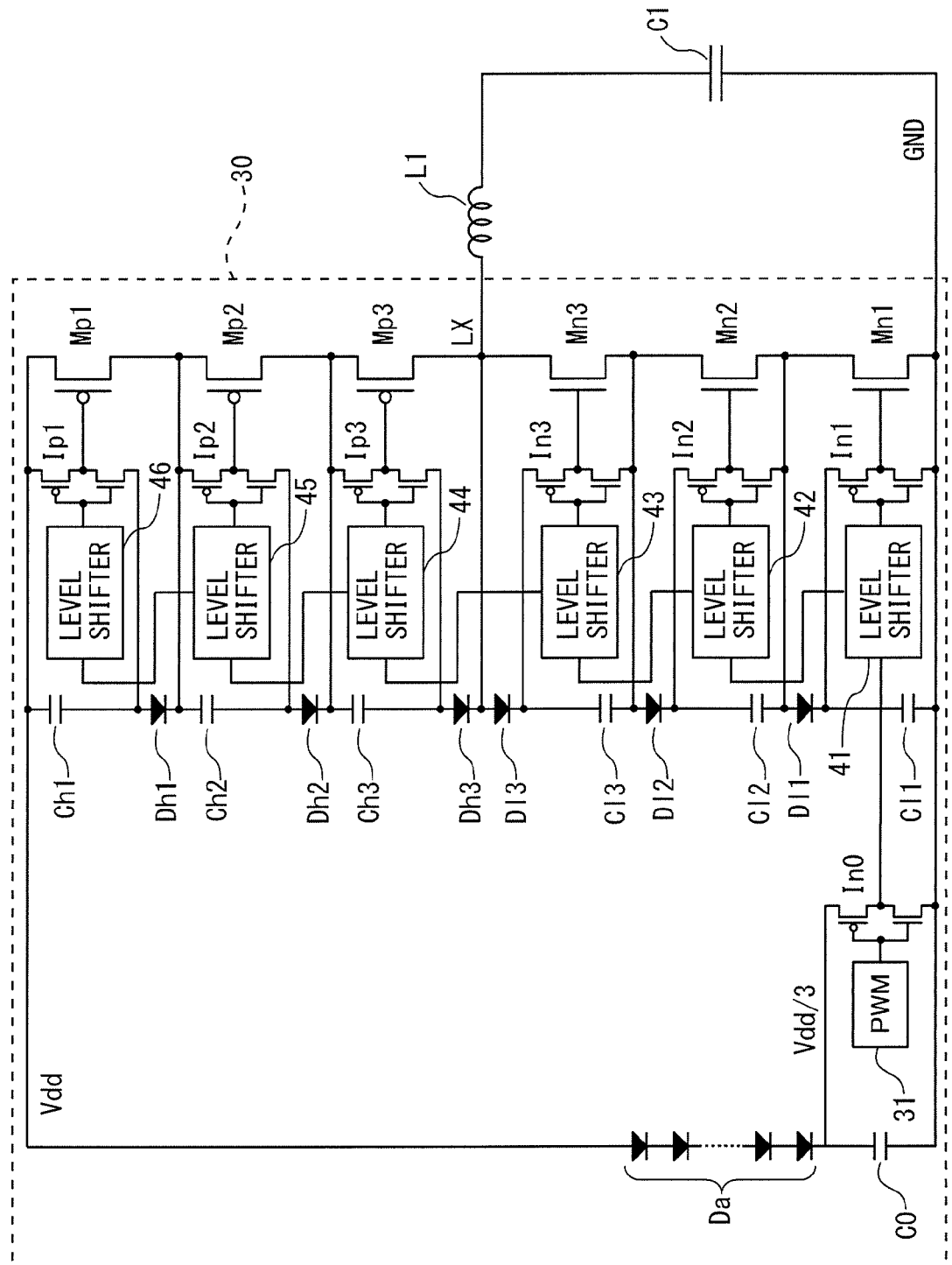
FIG. 7 is a circuit diagram of a DC-DC converter of a first embodiment.

FIG. 7 is a circuit diagram of a DC-DC converter of a first embodiment.

The DC-DC converter of the first embodiment has the capacitor C1 one terminal of which is grounded, the inductor L1 one terminal of which is connected to the other terminal of C1, and a charge and discharge signal circuit 30 configured to output an alternating-current signal to an output node LX connected to the other terminal of L1.

In the DC-DC converter of the first embodiment, only the charge and discharge signal circuit 30 may be turned into an integrated circuit, however, it is possible to use the inductor L1 having a small inductance value, and therefore, it is also be possible to turn the entire configuration illustrated in FIG. 7 into an integrated circuit.

The charge and discharge signal circuit 30 has the three high side transistors Mp1 to Mp3 connected in series between the high potential side power source Vdd and LX and the three low side transistors Mn1 to Mn3 connected in series between the low potential side power source GND and LX. Because of limitation to schematic representation, the case is illustrated where the charge and discharge signal circuit 30 has the three high side transistors Mp1 to Mp3 and the three low side transistors Mn1 to Mn3, respectively, however, it is also possible to increase the number of transistors to four or more as will be described later. The high side transistors Mp1 to Mp3 are each a PMOS transistor and the low side transistors Mn1 to Mn3 are each an NMOS transistor.

In the charge and discharge signal circuit 30, a current flows from Vdd to LX when the three high side transistors Mp1 to Mp3 turn on at the same time and the three low side transistors Mn1 to Mn3 turn off at the same time. Further, a current flows from LX to GND when the three high side transistors Mp1 to Mp3 turn off at the same time and the three low side transistors Mn1 to Mn3 turn on at the same time.

The charge and discharge signal circuit 30 has three high side drive circuits in correspondence to the three high side transistors Mp1 to Mp3 and three low side drive circuits in correspondence to the three low side transistors Mn1 to Mn3.

Further, the charge and discharge signal circuit 30 has a diode string Da and a capacitor C0 connected in series between Vdd and GND, a PWM control circuit 31 configured to output a PWM signal, which is a drive signal, and a drive inverter In0 of the PWM signal. The number of diodes in the diode string Da is set so that the voltage at the connection node of the diode string Da and the capacitor C0 becomes Vdd/3. Although not illustrated, as in FIG. 1, the output voltage Vout at the connection node of L1 and C1 is fed back to the PWM control circuit 31, and the PWM control circuit 31 changes the duty ratio of the PWM signal in accordance with Vout. The inverter In0 outputs a signal that swings between Vdd/3 and 0 V in accordance with the PWM signal.

The first high side drive circuit has a capacitor Ch1 and a diode Dh1 connected in series between Vdd and the connection node of Mp1 and Mp2, a level shifter 46, and an inverter (high side drive part) Ip1. Ip1 is connected between Vdd and the connection node of Ch1 and Dh1, i.e., in parallel with Ch1, receives the output of the level shifter 46, and applies the output to the gate of Mp1.

The second high side drive circuit has a capacitor Ch2 and a diode Dh2 connected in series between the connection node of Mp1 and Mp2 and the connection node of Mp2 and Mp3, a level shifter 45, and an inverter Ip2. Ip2 is connected between the connection node of Mp1 and Mp2 and the connection node of Ch2 and Dh2, i.e., in parallel with Ch2, receives the output of the level shifter 45, and applies the output to the gate of Mp2.

The third high side drive circuit has a capacitor Ch3 and a diode Dh3 connected in series between the connection node of Mp2 and Mp3 and the output node LX, a level shifter 44, and an inverter Ip3. Ip3 is connected between the connection node of Mp2 and Mp3 and the connection node of Ch3 and Dh3, i.e. in parallel with Ch3, receives the output of the level shifter 44, and applies the output to the gate of Mp3.

The first low side drive circuit has a capacitor Cl1 and a diode Dl1 connected in series between GND and the connection node of Mn1 and Mn2, a level shifter 41, and an inverter (low side drive part) In1. In1 is connected between GND and the connection node of Cl1 and Dl1, i.e., in parallel with Cl1, receives the output of the level shifter 41, and applies the output to the gate of Mn1.

The second low side drive circuit has a capacitor Cl2 and a diode Dl2 connected in series between the connection node of Mn1 and Mn2 and the connection node of Mn2 and Mn3, a level shifter 42, and an inverter In2. In2 is connected between the connection node of Mn1 and Mn2 and the connection node of Cl2 and Dl2, i.e., in parallel with Cl2, receives the output of the level shifter 42, and applies the output to the gate of Mn2.

The third low side drive circuit has a capacitor Cl3 and a diode Dl3 connected in series between the connection node of Mn2 and Mn3 and the output node LX, a level shifter 43, and an inverter In3. In3 is connected between the connection node of Mn2 and Mn3 and the connection node of Cl3 and Dl3, i.e., in parallel with Cl3, receives the output of the level shifter 43, and applies the output to the gate of Mn3.

Ch1, Dh1, Ch2, Dh2, Ch3, Dh3, Dl3, Cl3, Dl2, Cl2, Dl1, and Cl1 are connected in series in this order between Vdd and GND.

Figure 8:
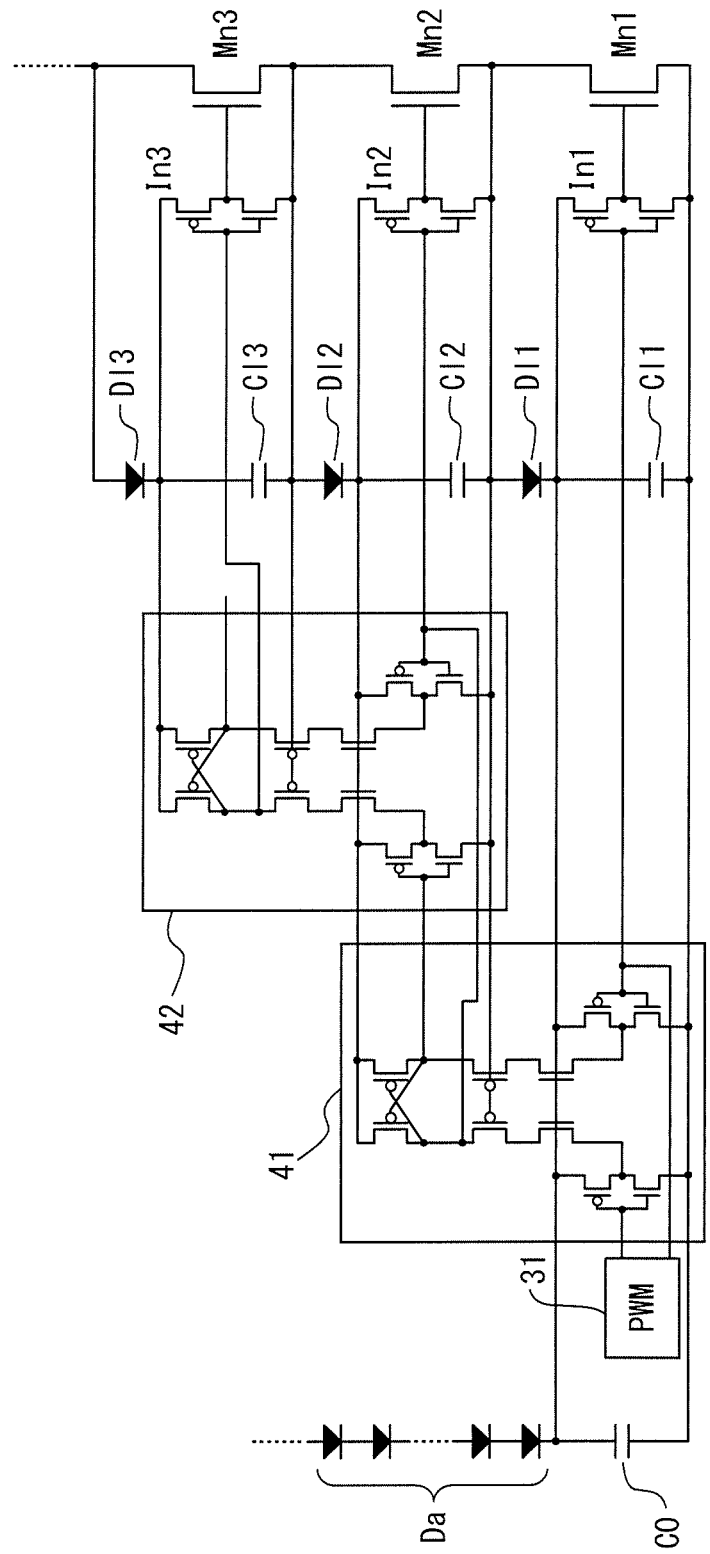
FIG. 8 is a circuit diagram of the level shifters.

FIG. 8 is a circuit diagram of the level shifters 41 and 42.

The level shifter 41 has a lower stage inverter pair connected between the connection node (Vdd/3) of Dl1 and Cl1 and GND, and three pairs of transistors vertically stacked between the inverter pair as a source and the connection node of Dl2 and Cl2. The level shifter 41 outputs the input of the lower stage inverter pair (output of the PWM control circuit 31) to the input of In1 and outputs a differential signal between the two pairs of transistors in the upper stage to the level shifter 42. The level shifters 42 to 46 have the same circuit configuration, however, differ in that the power sources to be connected sequentially shift and in that the input is input from the previous stage. In either case, each level shifter outputs a shift signal, to be described later, in accordance with the PWM drive signal, the output in the previous stage corresponding thereto, and the power source voltage to be supplied. While the output of the PWM control circuit 31 is inverted in In0 and then supplied to the level shifter 41 in FIG. 7, the output of the PWM control circuit 31 is supplied directly to the level shifter 41 in FIG. 8. Consequently, the logic of the output of the PWM control circuit 31 is inverted between FIG. 7 and FIG. 8, however, this may be set appropriately.

Figure 9A:
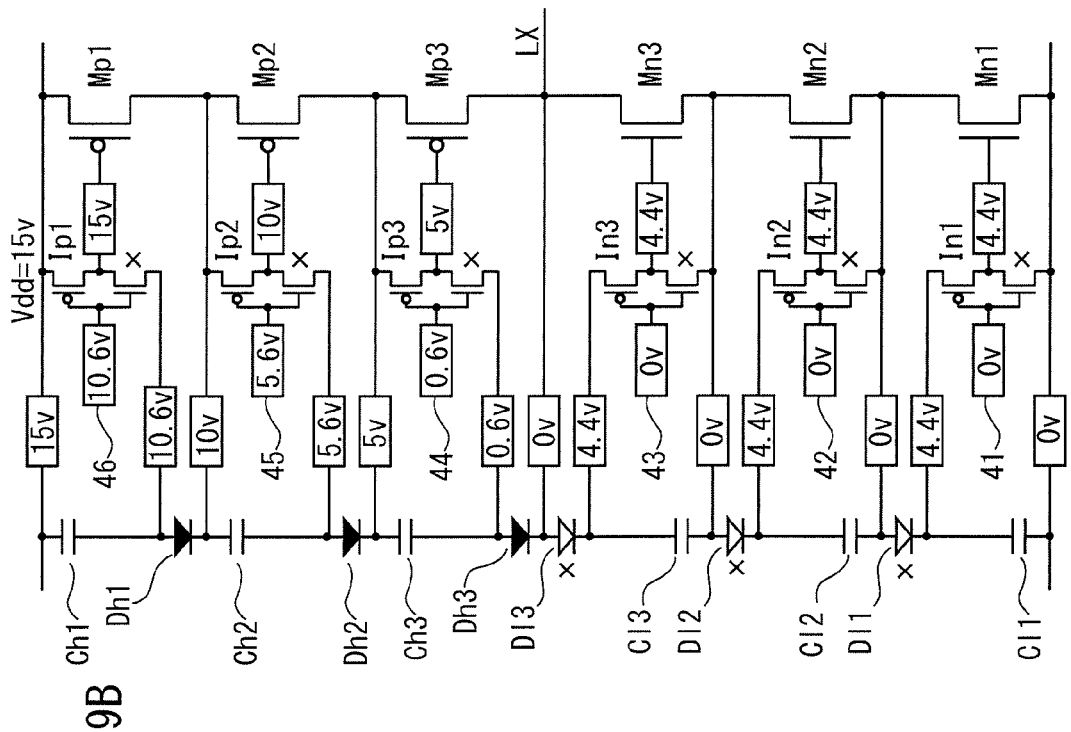
FIG. 9A and FIG. 9B are diagrams each explaining the operation of the charge and discharge signal circuit in the DC-DC converter of the first embodiment.
Figure 9B:
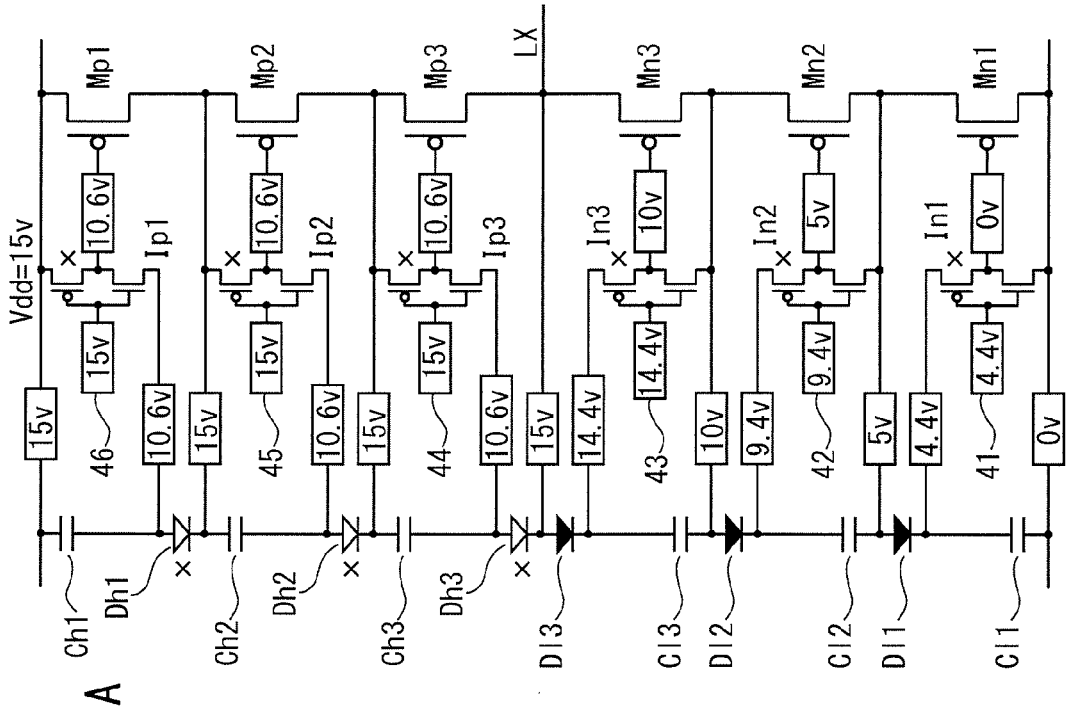

FIG. 9A and FIG. 9B are diagrams each explaining the operation of the charge and discharge signal circuit 30 in the DC-DC converter of the first embodiment, and FIG. 9A illustrates the case where Vdd=15 V is output to the output node LX and FIG. 9B illustrates the case where GND=0 V is output to the output node LX. The following explanation is given in the same manner. In FIG. 9A and FIG. 9B, the cross mark is attached to the side of the transistor that enters the off state.

As illustrated in FIG. 9A, in the case where LX is output to Vdd, each level shifter outputs the "high (H)" level and in response to this, the NMOS transistors of In1 to In3 and Ip1 to Ip3 turn on and the PMOS transistors turn off. Because of this, In1 to In3 and Ip1 to Ip3 each output the voltage at the connection node of the capacitor and the diode of each of the low side drive circuits and the high side drive circuits. In response to this, Mp1 to Mp3 turn on and Mn1 to Mn3 turn off.

Since Mp1 to Mp3 turn on, Vdd=15 V is supplied to LX and the voltage at the connection node of Mp1 and Mp2 and the voltage at the connection node of Mp2 and Mp3 become 15 V. Because of this, Dh1, Dh2, and Dh3 turn off. To both ends of Ip1, Vdd=15 V and a voltage of 10.6 V reduced by the voltage stored in Ch1 are applied. Similarly, to both ends of Ip2, a voltage of 15 V at the connection node of Mp1 and Mp2 and a voltage of 10.6 V reduced by the voltage stored in Ch2 are applied. To both ends of Ip3 also, 15 V and 10.6 V are applied. Consequently, the conditions under which Mp1 to Mp3 turn on are implemented.

On the other hand, Mn1 to Mn3 turn off, and therefore, to both ends of the string of Dl3, Cl3, Dl2, Cl2, Dl1, and Cl1 connected in series, Vdd=15 V and GND are applied. Due to this, at the connection node between the strings, a voltage occurs, which is obtained by dividing the voltage reduced by the voltage corresponding to the voltage drop of the diode by the serial capacitors (having the same capacitance value). Specifically, the voltage at the connection node of Cl1 and Dl1 is 4.4 V, that at the connection node of Dl1 and Cl2 is 5 V, that at the connection node of Cl2 and Dl2 is 9.4 V, that at the connection node of Dl2 and Cl3 is 10 V, and that at the connection node of Cl3 and Dl3 is 14.4 V. In correspondence to this, the voltage at the connection node of Mn1 and Mn2 becomes 5 V, that at the connection node of Mn2 and Mn3 becomes 10 V, and the outputs of In1 to In3 become 0 V, 5 V, and 10 V, respectively. Consequently, the conditions under which Mn1 to Mn3 turn off are implemented.

To both ends of the string of Dl3, Cl3, Dl2, Cl2, Dl1, and Cl1 connected in series, Vdd=15 V and GND=0 V are applied, and therefore, Cl3, Cl2, and Cl1 are charged by the voltage at both ends. That is, to both ends of Cl3, Cl2, and Cl1, 4.4 V is applied, respectively, and therefore, they are charged to 4.4 V.

As illustrated in FIG. 9B, in the case where 0 V is output to LX, each level shifter outputs the "low (L)" level and in response to this, the PMOS transistors of In1 to In3 and Ip1 to Ip3 turn on and the NMOS transistors turn off. Because of this, In1 to In3 and Ip1 to Ip3 each output the voltage on the high potential side of each of the low side drive circuits and the high side drive circuits. In response to this, Mp1 to Mp3 turn off and Mn1 to Mn3 turn on.

Since Mn1 to Mn3 turn on, GND=0 V is supplied to LX and the voltage at the connection node of Mn1 and Mn2 and the voltage at the connection node of Mn2 and Mn3 become 0 V. Because of this, Dl1, Dl2, and Dl3 turn off. To both ends of In1, GND=0 V and a voltage of 4.4 V raised by the voltage stored in Cl1 are applied. Similarly, to both ends of In2, a voltage of 0 V at the connection node of Mn1 and Mn2 and a voltage of 4.4 V raised by the voltage stored in Cl2 are applied and to both ends of In3 also, 0 V and 4.4 V are applied. Consequently, the conditions under which Mn1 to Mn3 turn on are implemented.

On the other hand, Mp1 to Mp3 turn off, and therefore, to both ends of the string of Ch1, Dh1, Ch2, Dh2, Ch3, and Dh3 connected in series, Vdd=15 V and GND are applied. Due to this, at the connection node between the strings, a voltage occurs, which is obtained by dividing the voltage reduced by the voltage corresponding to the voltage drop of the diode by the serial capacitors (having the same capacitance value). Specifically, the voltage at the connection node of Ch1 and Dh1 is 10.6 V, that at the connection node of Dh1 and Ch2 is 10 V, that at the connection node of Ch2 and Dh2 is 5.6 V, that at the connection node of Dh2 and Ch3 is 5 V, and that at the connection node of Ch3 and Dh3 is 0.6 V. In response to this, the voltage at the connection node of Mp1 and Mp2 becomes 10 V, that at the connection node of Mp2 and Mp3 becomes 5 V, the outputs of Ip1 to Ip3 become 15 V, 10 V, and 5 V, respectively. Consequently, the conditions under which Mp1 to Mp3 turn off are implemented.

To both ends of the string of Ch1, Dh1, Ch2, Dh2, Ch3, and Dh3 connected in series, Vdd=15 V and GND=0 V are applied, and therefore, Ch1, Ch2, and Ch3 are charged by the voltage at both ends thereof. That is, to both ends of Ch1, Ch2, and Ch3, 4.4 V is applied, respectively, and therefore, they are charged to 4.4 V.

As explained above, the high side switching transistors of Mp1 to Mp3 and the low side switching transistors of Mn1 to Mn3 turn on and off alternately. On the side on which the transistors turn off, Vdd and GND are applied to both ends of the string of capacitor and diode and the capacitors are charged. On the side on which the transistors turn on, the diodes turn off and in the high side and low side drive circuits, the source voltage of the switching transistor and the source voltage changed by the voltage charged in the capacitor are applied. Because of this, the voltage to be applied to the gate of the switching transistor does not become equal to or higher than the voltage charged in the capacitor, and therefore, application of an excessive voltage is prevented without fail.

In the present embodiment, the capacitors Ch1 to Ch3 and Cl1 to Cl3 are provided, however, the capacitance thereof only needs to be about twice to three times the gate capacitance of each switching transistor. Because of this, the entire area is about 2.5 to 4.5 times that of the conventional circuit, which is considerably small compared to that in the case where the bias capacitor is provided illustrated in FIG. 4.

Figure 10:
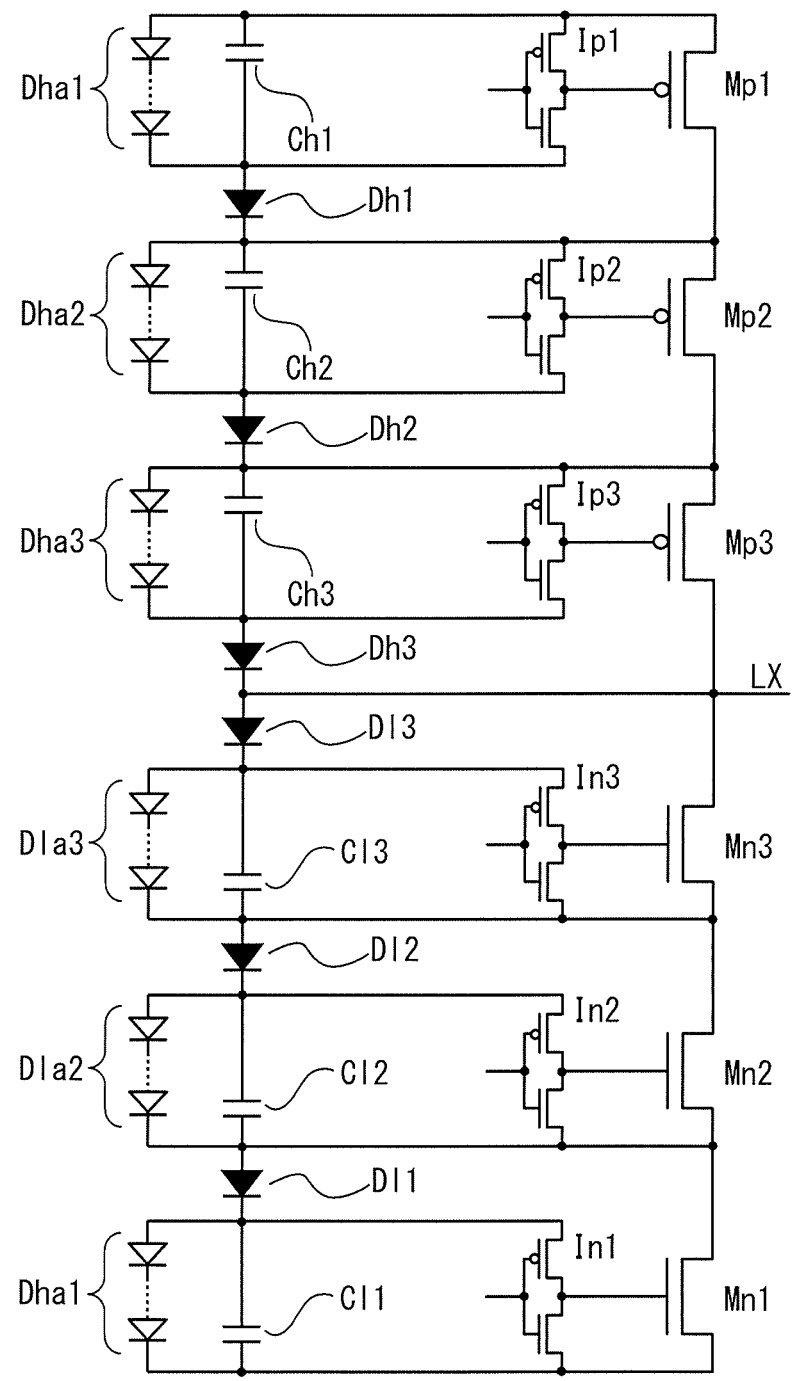
FIG. 10 is a diagram illustrating a modification example of the DC-DC converter of the first embodiment.

FIG. 10 is a diagram illustrating a modification example of the DC-DC converter of the first embodiment.

In the first embodiment, the capacitors Ch1 to Ch3 and Cl1 to Cl3 are charged, however, there may occur a case where the capacitor is charged to a voltage larger than the supposed voltage due to the timing etc. of switching. Because of this, in the modification example illustrated in FIG. 10, diode strings Dha1 to Dha3 and Dla1 to Dla3 are provided in parallel with the capacitors Ch1 to Ch3 and Cl1 to Cl3. The number of diode strings is the minimum integer of integers larger than a value, which is the voltage to which the capacitors Ch1 to Ch3 and Cl1 to Cl3 are charged is divided by the voltage corresponding to the voltage drop of the diode.

In the circuit configuration illustrated in FIG. 10, in the case where a voltage larger than the supposed voltage is applied to both ends of the capacitors Ch1 to Ch3 and Cl1 to Cl3, a current flows through the diode string, and therefore, the capacitors Ch1 to Ch3 and Cl1 to Cl3 are not charged to a voltage larger than the supposed voltage. Due to this, it is possible to prevent the switching transistors Mp1 to Mp3 and Mn1 to Mn3 from being destroyed, which would occur if a voltage other than the supposed voltage is applied to the gates thereof.

Figure 11A:
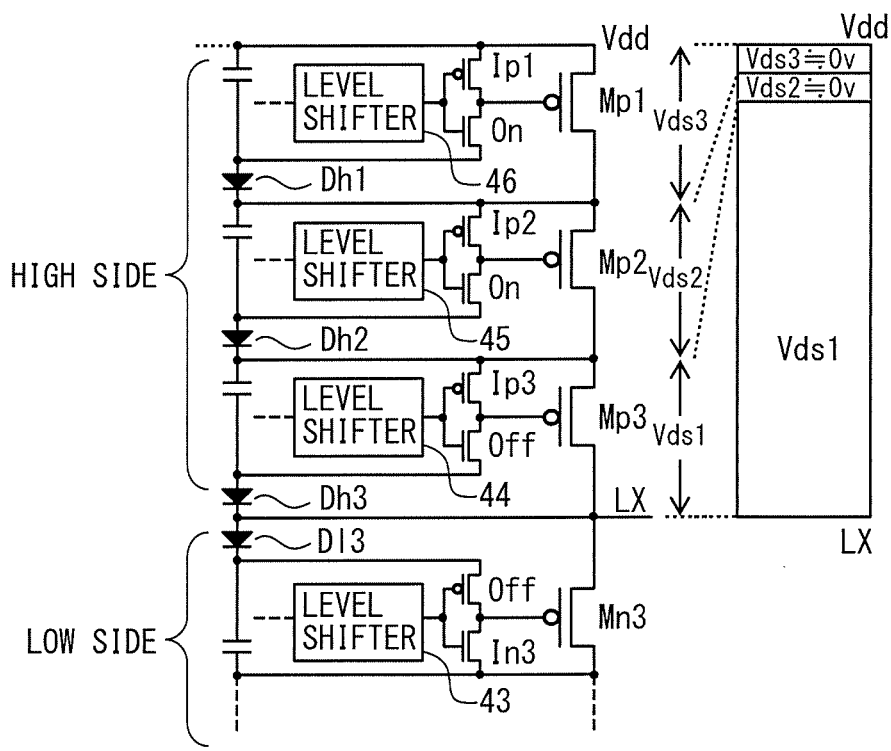
FIG. 11A and FIG. 11B are diagrams each illustrating a modification example for addressing a problem different from that of the DC-DC converter of the first embodiment.
Figure 11B:
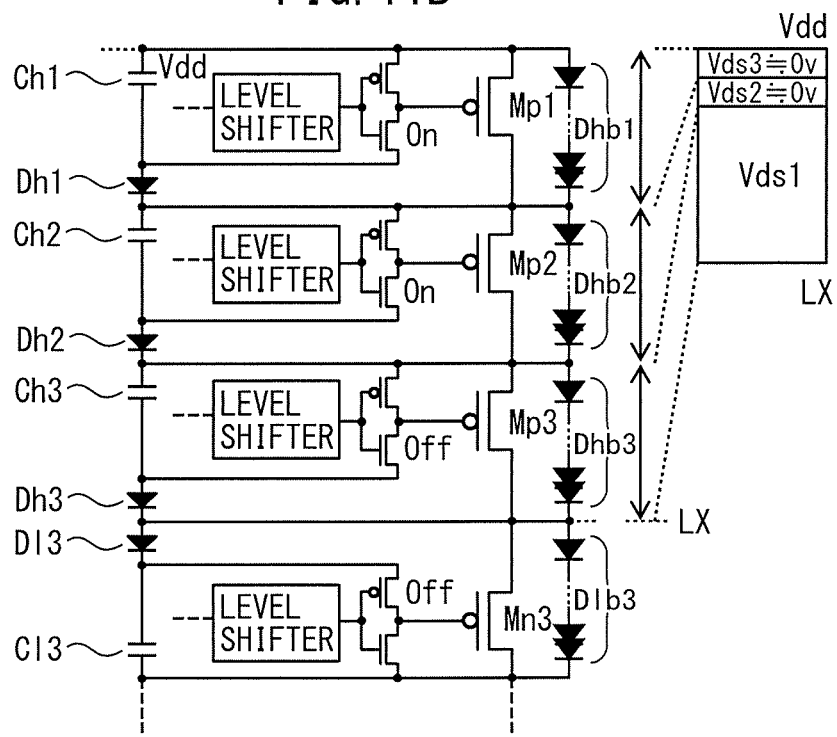

FIG. 11A and FIG. 11B are diagrams each illustrating a modification example for addressing a problem different from that of the DC-DC converter of the first embodiment.

The on/off timing of the high side transistors Mp1 to Mp3 and the low side transistors Mn1 to Mn3 for switching slightly deviates from that in the ideal case in actuality. As a result of that, there is a possibility that an excessive voltage is applied between the drain and source of the switching transistor having turned off earlier. FIG. 11A illustrates the case where Mp3 has turned off earlier in the state where Mp1 and Mp2 are in the on state. In this case, as illustrated in FIG. 11A, a large voltage of about 15 V is applied to both ends of Mp3 and there is a possibility that Mp3 is destroyed.

Because of this, as illustrated in FIG. 11B, diode strings Dhb1 to Dhb3 and Dlb1 and Dlb3 are provided in parallel with the high side transistors Mp1 to Mp3 and the low side transistors Mn1 to Mn3 for switching. The number of diode strings is the minimum integer of integers larger than a value, which is the voltage (here, 5 V) supposed to be applied to both ends of Mp1 to Mp3 and Mn1 to Mn3 divided by the voltage corresponding to the voltage drop of the diode.

Due to this, even in the case also where Mp3 turns off earlier in the state where Mp1 and Mp2 are in the on state as described above, a current flows through the diode string Dhb3, and therefore, a large voltage is not applied to Mp3. Due to this, it is possible to prevent the switching transistors Mp1 to Mp3 and Mn1 to Mn3 from being destroyed, which would occur if a voltage other than the supposed voltage is applied between the drain and source of the switching transistors.

A combination of Dha1 and Dh1 in FIG. 10 performs the same action as that of Dhb1. This also applies to the other diode strings. Consequently, also in the modification example illustrated in FIG. 10, the same action as that in the modification example illustrated in FIG. 11B is performed.

Figure 12:
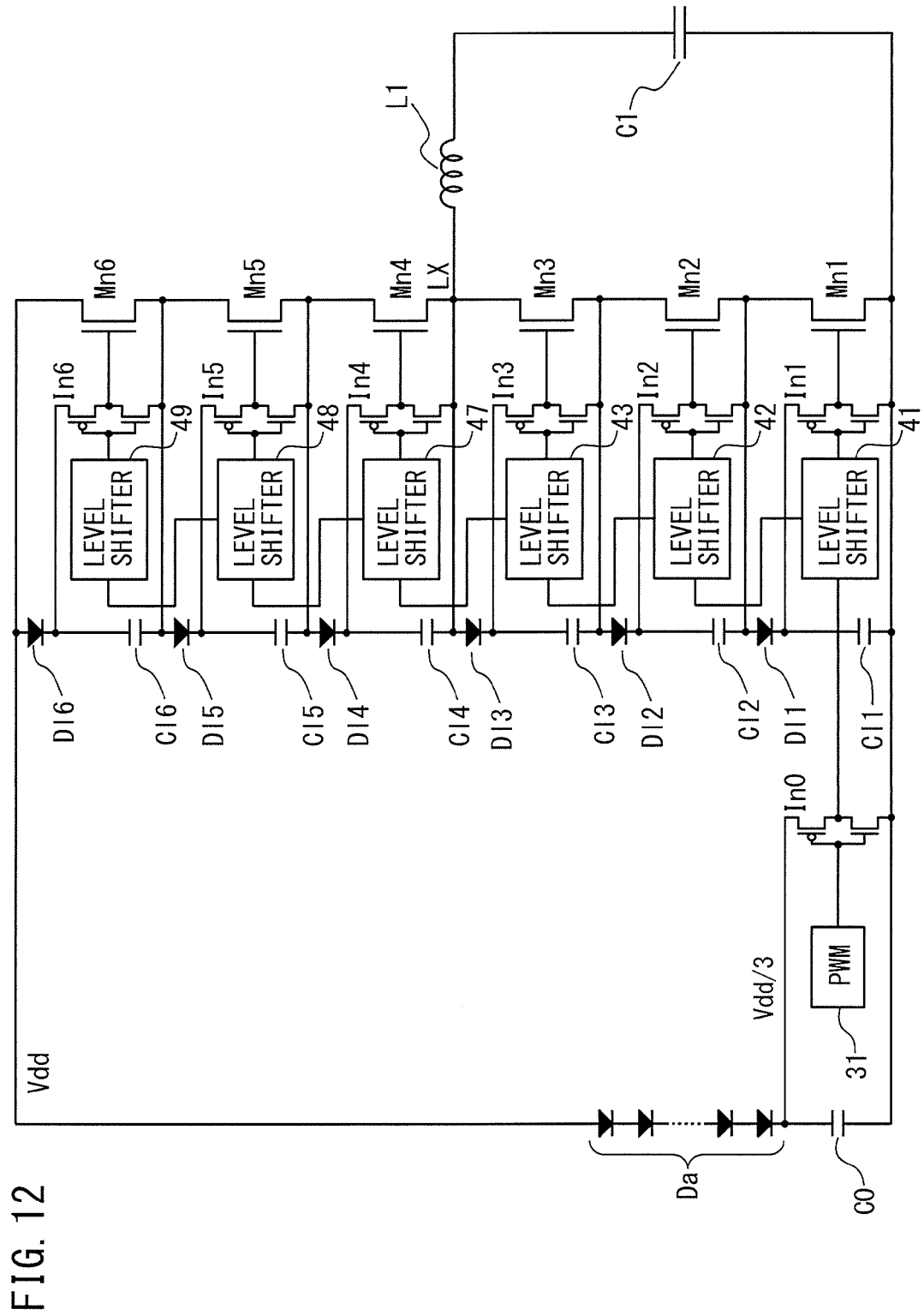
FIG. 12 is a circuit diagram of a DC-DC converter of a second embodiment.

FIG. 12 is a circuit diagram of a DC-DC converter of a second embodiment.

The DC-DC converter of the second embodiment differs from that of the first embodiment in that NMOS transistors Mn6 to Mn4 are used in place of the high side transistors Mp1 to Mp3 for switching. Accompanying this change, Ip1 to Ip3 are replaced with In6 to In4 in correspondence to Mn6 to Mn4, however, the circuit itself is the same. Further, the level shifters 44 to 46 are changed to level shifters 47 to 49. It is necessary to apply a signal to the gates of Mn4 to Mn6, which is of opposite phase (inverted signal) to that of the signal applied to the gates of Mn1 to Mn3. The level shifters 47 to 49 have the same circuit configuration as that of the level shifter illustrated in FIG. 8, however, the level shifters 47 to 49 differ from the level shifters 44 to 46 in that the signal output to the gates of In4 to In6 is of opposite phase to that thereof. Further, the connection order of the capacitor and the diode string on the high side is changed.

The operation of the DC-DC converter of the second embodiment is the same as that in the case of the first embodiment, and therefore, explanation is omitted.

The NMOS transistor is implemented with a small area compared to that of the PMOS transistor, and therefore, the area is reduced to about ½ compared to that in the first embodiment.

Figure 13:
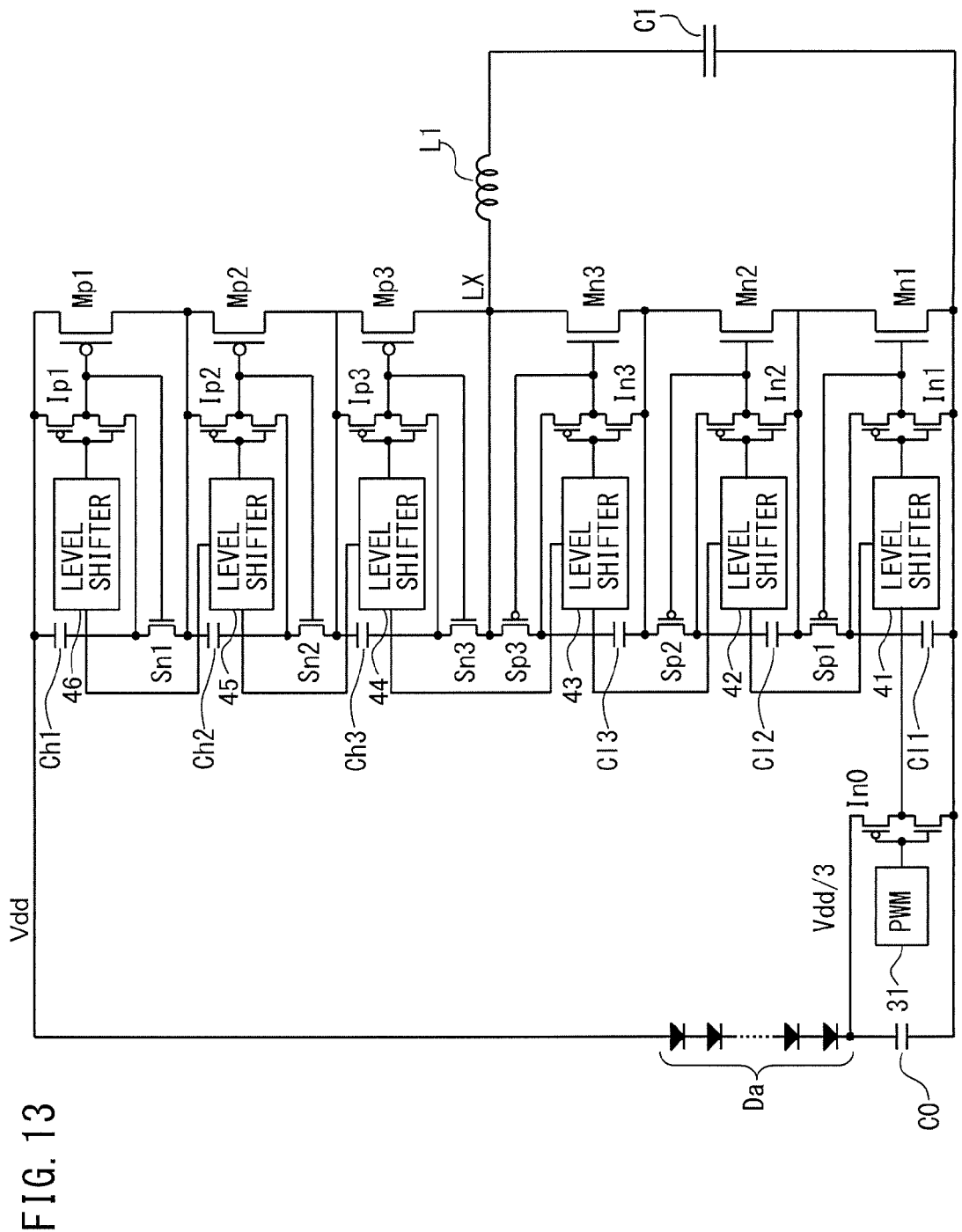
FIG. 13 is a circuit diagram of a DC-DC converter of a third embodiment.

FIG. 13 is a circuit diagram of a DC-DC converter of a third embodiment.

The DC-DC converter of the third embodiment differs from that of the first embodiment in that NMOS transistors Sn1, Sn2, and Sn3 and PMOS transistors Sp1, Sp2, and Sp3 are connected in place of the diodes Dh1, Dh2, Dh3, Dl1, Dl2, and Dl3.

To the gates of Sn1, Sn2, Sn3, Sp1, Sp2, and Sp3, the outputs of Ip1, Ip2, Ip3, In1, In2, and In3 are applied and Sn1, Sn2, Sn3, Sp1, Sp2, and Sp3 operate as a switch. Specifically, Sn1 to Sn3 turn off when Mp1 to Mp3 are on and turn on when Mp1 to Mp3 are off. Sp1 to Sp3 turn off when Mn1 to Mn1 are on and turn on when Mn1 to Mn3 are off. Due to this, Sn1 to Sn3 and Sp1 to Sp3 perform the same switching operation as that of Dh1 to Dh3 and Dl1 to Dl3 and alternately perform the charging operation of Ch1 to Ch3 and Cl1 to Cl3.

Figure 14:
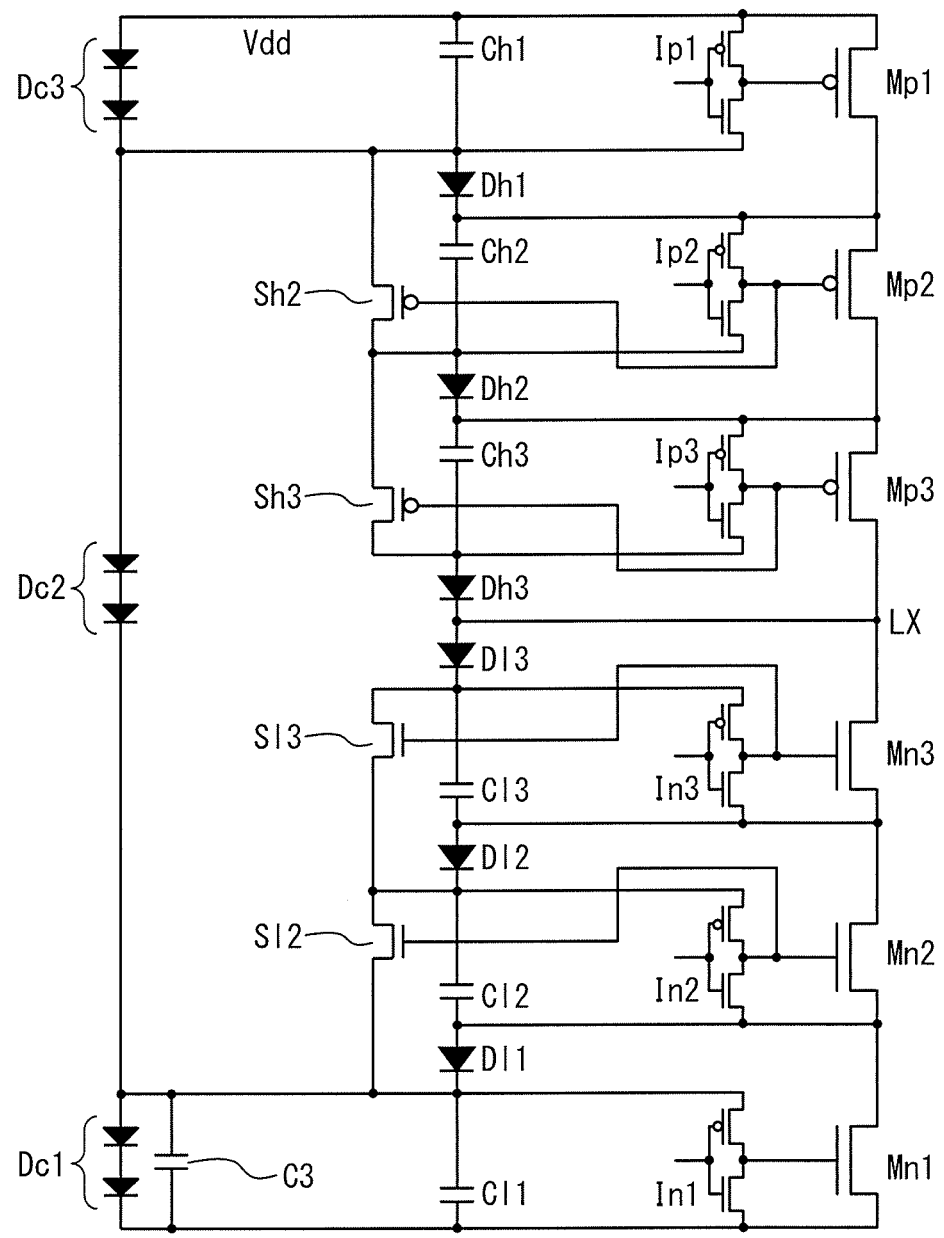
FIG. 14 is a circuit diagram of a charge and discharge signal circuit of a DC-DC converter of a fourth embodiment.

FIG. 14 is a circuit diagram of a charge and discharge signal circuit of a DC-DC converter of a fourth embodiment. The PWM control circuit and the inverter and the level shifter of the PWM signal are not illustrated.

The charge and discharge signal circuit of the fourth embodiment differs from that of the first embodiment in the following points.

First, the charge and discharge signal circuit of the fourth embodiment has a plurality of diode strings Dc1, Dc2, and Dc3 connected in series between Vdd and GND, and a capacitor C3 connected in parallel with Dc1. The connection node of Dc1 and Dc2 is connected to the connection node of Cl1 and Dl1, and the connection node of Dc2 and Dc3 is connected to the connection node of Ch1 and Dh1. The voltage at the connection node of Dc1 and Dc2 is set to an arbitrary value in the range not exceeding the withstand voltage of the transistor, for example, about Vdd/3=4.4 V. The voltage at the connection node of Dc2 and Dc3 is set to an arbitrary value in the range in which the difference in voltage from Vdd does not exceed the withstand voltage of the transistor, for example, to about 2Vdd/3=10.6 V so that Vdd/3 is achieved. These voltages are set according to the number of diodes of Dc1, Dc2, and Dc3, respectively.

Further, a PMOS transistor Sh2 is connected between the connection node of Ch1 and Dh1 and the connection node of Ch2 and Dh2, and a PMOS transistor Sh3 is connected between the connection node of Ch2 and Dh2 and the connection node of Ch3 and Dh3. Furthermore, an NMOS transistor Sl2 is connected between the connection node of Cl1 and Dl1 and the connection node of Cl2 and Dl2, and an NMOS transistor Sl3 is connected between the connection node of Cl2 and Dl2 and the connection node of Cl3 and Dl3. To the gate of Sh2, the output of Ip2, to the gate of Sh3, the output of Ip3, to the gate of Sl2, the output of In2, and to the gage of Sl3, the output of In3 are applied, respectively.

In the charge and discharge signal circuit of the fourth embodiment, as in the first embodiment, in the case where Vdd is output to LX, Cl1 to Cl3 are charged and in the case where 0 V is output to LX, Ch1 to Ch3 are charged. However, there occurs a case where the capacitors are not charged sufficiently only by the above-described charging, and therefore, in the fourth embodiment, Ch1 to Ch3 are charged also in the case where Vdd is output to LX and Cl1 to Cl3 are charged also in the case where 0 V is output to LX.

In the charge and discharge signal circuit of the fourth embodiment, to both ends of Ch1 and Ip1, 15 V and 10.6 V, and to both ends of Cl1 and In1, 4.4 V and 0 V are applied, respectively, at all times. In other words, the voltage at the connection node of Ch1 and Dh1 is always 10.6 V, which is the voltage at the connection node of Dc2 and Dc3. Further, the voltage at the connection node of Cl1 and Dl1 is always 4.4 V, which is the voltage at the connection node of Dc1 and Dc2.

As illustrated in FIG. 9A, when Mp1 to Mp3 are on, the voltage at the connection node of Dh1 and Ch2 is 15 V and the voltage at the connection node of Ch2 and Dh2 is 10.6 V, which is reduced by 4.4 V of the charged voltage of Ch2. Consequently, both the voltage at the connection node of Ch1 and Dh1 and the voltage at the connection node of Ch2 and Dh2 are 10.6 V.

When Sh2 is turned on and the connection node of Ch1 and Dh1 and the connection node of Ch2 and Dh2 are connected, to one terminal of Ch2, 15 V is applied via Mp1 and to the other terminal of Ch2, 10.6 V, which is the voltage at the connection node of Dc2 and Dc3, is applied via Sh2. Due to this, Ch2 is charged so as to have a voltage difference of 4.4 V.

This is also true for Ch3 and 15 V is applied via Mp1 and Mp2 and 10.6 V is applied via Sh2 and Sh3, and Ch3 is charged so as to have a voltage different of 4.4.

When Mp1 to Mp3 are on, Mn1 to Mn3 are off and Sl2 and Sl3 are off, and Cl2 and Cl3 are charged in the same manner as in the first embodiment.

On the other hand, as illustrated in FIG. 9B, when Mn1 to Mn3 are on, the voltage at the connection node of Dl1 and Cl2 is 0 V and the voltage at the connection node of Cl2 and Dl2 is 4.4 V, which is raised by 4.4 V of the charged voltage of Cl2. Consequently, both the voltage at the connection node of Cl1 and Dl1 and the voltage at the connection node of Cl2 and Dl2 are 4.4 V.

When Sl2 is turned on and the connection node of Cl1 and Dl1 and the connection node of Cl2 and Dl2 are connected, to one terminal of Cl2, 0 V is applied via Mn1 and to the other terminal of Cl2, 4.4 V, which is the voltage at the connection node of Dc1 and Dc2, is applied via Sl2. Due to this, Cl2 is charged so as to have a voltage difference of 4.4 V.

This is also true for Cl3 and 0 V is applied via Mn1 and Mn2 and 4.4 V is applied via Sl2 and Sl3, and Cl3 is charged so as to have a voltage difference of 4.4 V.

When Mn1 to Mn3 are on, Mp1 to Mp3 are off and Sh2 and Sh3 are off, and Ch2 and Ch3 are charged in the same manner as in the first embodiment.

As explained above, in the fourth embodiment, both in the state where Vdd is output to LX and in the stage where GND is output to LX, Ch1 to Ch3 and Cl1 to Cl3 are charged.

Figure 15:
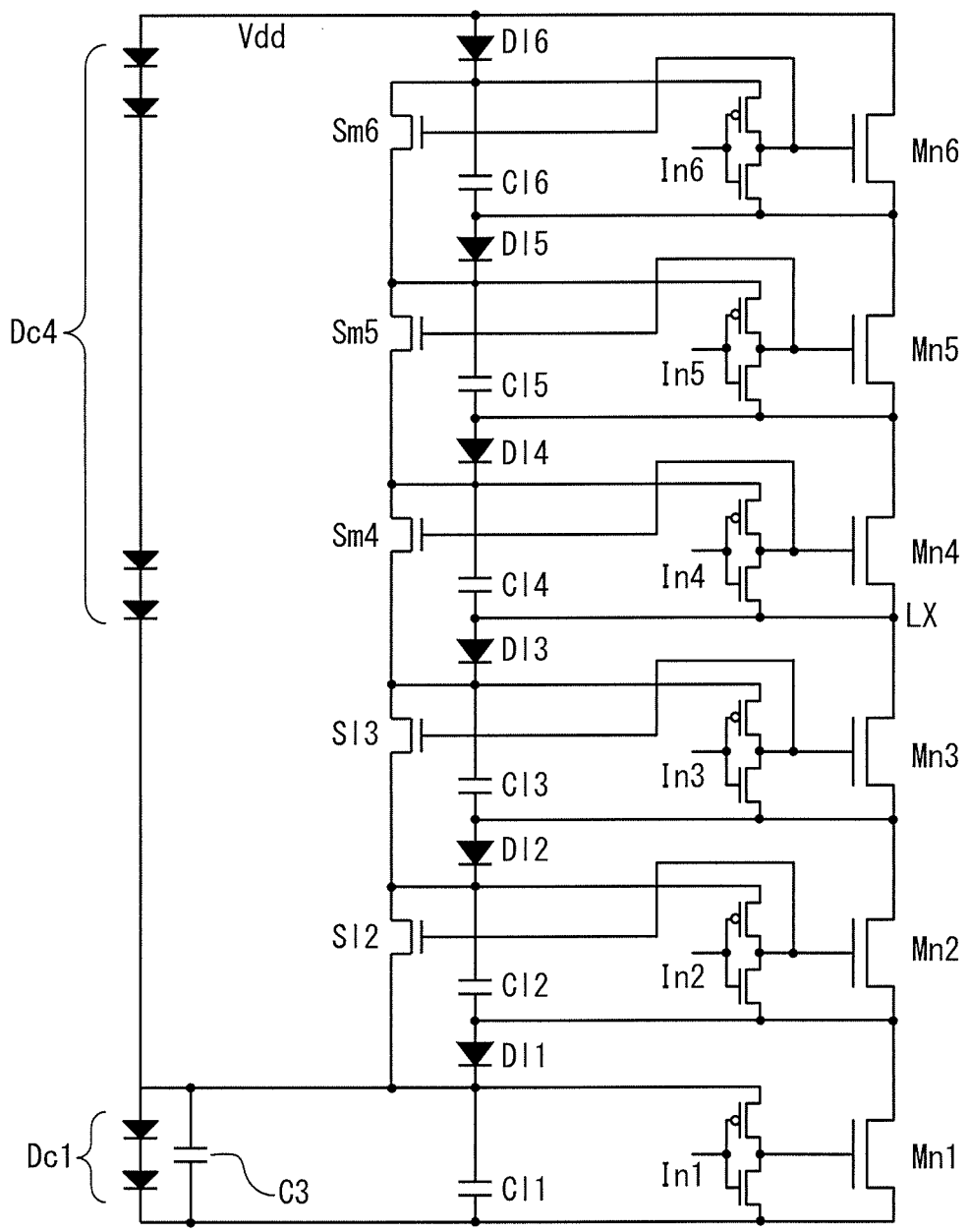
FIG. 15 is a circuit diagram of a charge and discharge signal circuit of a DC-DC converter of a fifth embodiment.

FIG. 15 is a circuit diagram of a charge and discharge signal circuit of a DC-DC converter of a fifth embodiment. In FIG. 15 also, the PWM control circuit and the inverter and the level shifter of the PWM signal are not illustrated.

The charge and discharge signal circuit of the fifth embodiment differs from that of the second embodiment in the following points.

First, the charge and discharge signal circuit has two diode strings, i.e. the diode string Dc1 and a diode string Dc4 connected in series between Vdd and GND, and the capacitor C3 connected in parallel with Dc1. The connection node of Dc1 and Dc4 is connected to the connection node of Cl1 and Dl1. As in the fourth embodiment, the voltage at the connection node of Dc1 and Dc4 is set to an arbitrary value in the range not exceeding the withstand voltage of the transistor, for example, about Vdd/3=4.4 V. This voltage is set according to the number of diodes of Dc1 and Dc4, respectively.

Further, the NMOS transistor Sl2 is connected between the connection node of Cl1 and Dl1 and the connection node of Cl2 and Dl2, and the NMOS transistor Sl3 is connected between the connection node of Cl2 and Dl2 and the connection node of Cl3 and Dl3. Further, a PMOS transistor Sm4 is connected between the connection node of Cl3 and Dl3 and the connection node of Cl4 and Dl4. Further, an NMOS transistor Sm5 is connected between the connection node of Cl4 and Dl4 and the connection node of Cl5 and Dl5 and an NMOS transistor Sm6 is connected between the connection node of Cl5 and Dl5 and the connection node of Cl6 and Dl6. To the gate of Sl2, the output of In2, to the gate of Sl3, the output of In3, to the gate of Sm4, the output of In4, to the gage of Sm5, the output of In5, and to the gage of Sm6, the output of In6 are applied, respectively.

In the charge and discharge signal circuit of the fifth embodiment, as in the second embodiment, In4 to In6 produce outputs opposite in logic to those produced by In1 to In3 so that Mn4 to Mn6 turn on and Mn1 to Mn3 turn off in the case where Vdd is output to LX. As described previously, this is performed by selecting the output of the level shifter. Further, In1 to In6 produce outputs so that Mn1 to Mn3 turn on and Mn4 to Mn6 turn off in the case where 0 V is output to LX.

In the charge and discharge signal circuit of the fifth embodiment, in the case where Vdd is output to LX, Cl1 to Cl3 are charged and in the case where 0 V is output to LX, Cl4 to Cl6 are charged. However, there occurs a case where the capacitors are not charged sufficiently only by the above-described charging, and therefore, in the fifth embodiment, Cl1 to Cl4 are charged also in the case where 0 V is output to LX and Cl5 and Cl6 are charged also in the case where Vdd is output to LX.

In the charge and discharge signal circuit of the fifth embodiment, to both ends of Cl1 and In1, 4.4 V and 0 V are applied at all times. In other words, the voltage at the connection node of Cl1 and Dl1 is always 4.4 V, which is the voltage at the connection node of Dc1 and Dc4.

When Mn1 to Mn3 are on, the voltage at the connection node of Dl1 and Cl2 is 0 V and the voltage at the connection node of Cl2 and Dl2 is 4.4 V, which is raised by 4.4 V of the charged voltage of Cl2. Consequently, both the voltage at the connection node of Cl1 and Dl1 and the voltage at the connection node of Cl2 and Dl2 are 4.4 V.

When Sl2 is turned on and the connection node of Cl1 and Dl1 and the connection node of Cl2 and Dl2 are connected, to one terminal of Cl2, 0 V is applied via Mn1 and to the other terminal of Cl2, 4.4 V, which is the voltage at the connection node of Dc1 and Dc4, is applied via Sl2. Due to this, Cl2 is charged so as to have a voltage difference of 4.4 V.

This is also true for Cl3 and 0 V is applied via Mn1 and Mn2 and 4.4 V is applied via Sl2 and Sl3, and Cl3 is charged so as to have a voltage difference of 4.4 V. In the manner as described above, Cl2 and Cl3 are charged more securely.

In the fifth embodiment, when Mn4 is off, Sm4 turns on since it is the PMOS transistor, and the connection node of Cl4 and Dl4 is connected to the connection node of Cl3 and Dl3 via Sm4 and 4.4 V is applied via Sl2 and Sl3. In other words, one terminal of Cl4 is connected to the output node LX, and therefore, 0 V is applied via Mn1 to Mn3, and to the other terminal of Cl4, 4.4 V is applied via Sl2, Sl3, and Sm4. Due to this, Cl4 is charged so as to have a voltage difference of 4.4 V. Of course, charging is performed by applying Vdd=15 V and GND=0 V to both ends of Dl6, Cl6, Dl5, Cl5, Dl4, and Cl4, however, Cl4 is charged to 4.4 V more securely.

When Mn1 to Mn3 are on, Mn4 to Mn6 are off and Sm5 and Sm6 are off, and Cl5 and Cl6 are charged in the same manner as that in the first embodiment as described above.

Next, when Mn1 to Mn3 turn off and Mn4 to Mn6 turn on, Cl2 and Cl3 are charged in the same manner as that in the fourth embodiment. In the fifth embodiment, the voltage charged in Cl4 is applied to Cl5 and Cl6 via Sm5 and Sm6.

When Mn4 to Mn6 are on, Sm5 and Sm6 also turn on. However, Sm4 is off. The voltage at the output node LX, the voltage at the connection node of Dl4 and Cl5, and the voltage at the connection node of Dl5 and Cl6 are 15 V. Cl4, Cl5, and Cl6 are charged to 4.4 V, and therefore, the voltage at the connection nodes of Cl4 and Dl4, Cl5 and Dl5, and Cl6 and Dl6 is 19.4 V. Because Sm5 and Sm6 are on, the terminals of Cl4, Cl5, and Cl6, at which the voltage is 19.4 V, are connected in common and to the other terminals, 15 V is applied in common. As described above, Cl4 is charged sufficiently, and therefore, when the charged amount of Cl5 and Cl6 is short, Cl5 and Cl6 are charged by Cl4. Due to this, Mn4 to Mn6 turn on without fail.

As explained above, in the fifth embodiment, on the low side, both in the stage where Vdd is output to LX and in the stage where GND is output to LX, Cl1 to Cl3 are charged. Charging of Cl4 on the high side is also performed in both the stages. Cl5 and Cl6 on the high side are charged when GND=0 V is output to LX and at the same time, Cl5 and Cl6 are charged by Cl4 when Vdd=15 V is output to LX.

Figure 16:
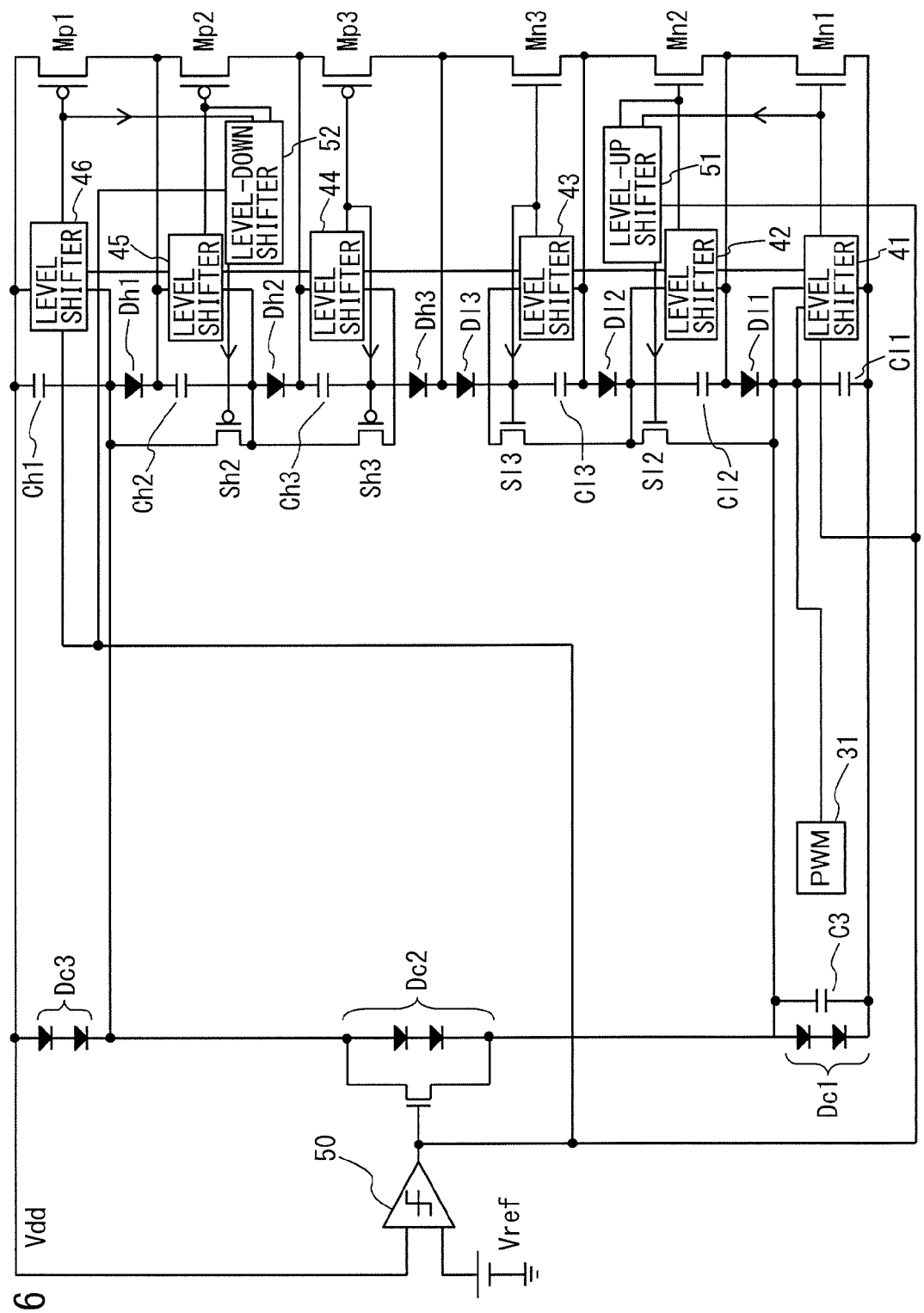
FIG. 16 is a circuit diagram of a charge and discharge signal circuit of a DC-DC converter of a sixth embodiment.

FIG. 16 is a circuit diagram of a charge and discharge signal circuit of a DC-DC converter of a sixth embodiment. In FIG. 16, the inverter of the PWM signal and the inverter of the level shifter are not illustrated.

The charge and discharge signal circuit of the sixth embodiment differs from the charge and discharge signal circuit of the fourth embodiment in that a comparator 50 that compares Vdd and a reference voltage Vref, a level-up shifter 51, and a level-down shifter 52 are provided.

The comparator 50 compares Vdd and Vref and if Vdd is equal to or higher than Vref, the comparator 50 outputs a high voltage state signal. In response to the high voltage state signal, the level shifters 41 and 46 perform the same operation as that in the fourth embodiment, and the level-up shifter 51 applies the gate signal of Mn2 to the gate of Sl2 and the level-down shifter 52 applies the gate signal of Mp2 to the gate of Sh2. Due to this, the charge and discharge signal circuit performs the same operation as that of the fourth embodiment in FIG. 14.

When Vdd is lower than Vref, the comparator 50 outputs a low voltage state signal. In response to the low voltage state signal, the level shifters 41 and 46 output signals to the level shifter 42 and the level shifter 45 in the same manner as that in the fourth embodiment, and also output signals that keep Mn1 and Mp1 on at all times. In other words, the level shifter 41 outputs the "H" level at all times and the level shifter 46 outputs the "L" level at all times.

Further, in response to the low voltage state signal, the level-up shifter 51 selects the output (H at all times) of the level shifter 41 and applies the output to the gate of Sl2 and the level-down shifter 52 selects the output (L at all times) of the level shifter 46 and applies the output to the gate of Sh2.

Consequently, when the low voltage state signal is output, Mn1, Mp1, Sl2, and Sh2 are in the on state at all times and on the high side and on the low side, the state is such that the switching transistors are vertically stacked in two stages in fact. Since Vdd is reduced, even in the state where the transistors are stacked vertically in two stages, no problem of the withstand voltage of the transistor occurs and the switching operation of Mn1 and Mp1 is not performed, and therefore, power consumption is reduced.

As above, the embodiments are explained, however, there can be various modification examples and the modification example of the first embodiment may be applied to the second to sixth embodiments and the configuration of an embodiment may be applied to the other embodiments.

According to the embodiments, only by attaching a capacitor whose capacitance is about twice to three times that of a gate parasitic capacitor of each transistor for switching, the DC-DC converter in which transistors are stacked vertically (multistage cascode connection) is implemented without complicated restrictions on the design.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A charge and discharge signal circuit comprising:
   a plurality of high side transistors connected in series between a high potential side power source and an output node;
   a plurality of low side transistors connected in series between a low potential side power source and the output node;
   a plurality of high side drive circuits provided respectively in correspondence to the plurality of high side transistors;
   a plurality of low side drive circuits provided respectively in correspondence to the plurality of low side transistors; and
   a drive signal generation circuit configured to output a drive signal, wherein
   each of the high side drive circuits includes:
      a high side level shifter configured to convert a level of the drive signal;
      a high side capacitor switch string of a capacitor and a switch element connected in series, being connected in parallel with the high side transistor; and
      a high side drive part connected between a source of the high side transistor and a connection node of the capacitor and the switch element of the high side capacitor switch string, to which an output of the high side level shifter is supplied, and which outputs a drive signal to the high side transistor, and
   each of the low side drive circuits includes:
      a low side level shifter configured to convert a level of the drive signal;
      a low side capacitor switch string of a capacitor and a switch element connected in series, being connected in parallel with the low side transistor; and
      a low side drive part connected between a source of the low side transistor and a connection node of the capacitor and the switch element of the low side capacitor switch string, to which an output of the low side level shifter is supplied, and which outputs a drive signal to the low side transistor.

2. The charge and discharge signal circuit according to claim 1, wherein
   when a high level is output from the output node:
      the switch element of the high side capacitor switch string of each of the high side drive circuits turns off and by a voltage charged in the capacitor, the plurality of high side drive parts drives the plurality of high side transistors to turn on; and
      the capacitor of the low side capacitor switch string of each of the low side drive circuits is charged and by a voltage, which is a voltage between the output node and the low potential side power source divided by the plurality of low side capacitor switch strings, the plurality of low side drive parts drives the plurality of low side transistors to turn off, and
   when a low level is output from the output node:
      the capacitor of the high side capacitor switch string of each of the high side drive circuits is charged and by a voltage, which is a voltage between the output node and the low potential side power source divided by the plurality of high side capacitor switch strings, the plurality of high side drive parts drives the plurality of high side transistors to turn off; and
      the switch element of the low side capacitor switch string of each of the low side drive circuits turns off and by a voltage charged in the capacitor, the plurality of low side drive parts drives the plurality of low side transistors to turn on.

3. The charge and discharge signal circuit according to claim 2, wherein the switch element is a diode.

4. The charge and discharge signal circuit according to claim 2, wherein the switch element is a transistor to the gate of which an output of the high side drive part is applied, and which turns off when the high side transistor turns on, and which turns on when the high side transistor turns off.

5. The charge and discharge signal circuit according to claim 2, wherein
   each of the high side drive circuits has a high side diode string including a plurality of diodes connected in series and connected in parallel with the high side capacitor switch string or the capacitor, and
   each of the low side drive circuits has a low side diode string including a plurality of diodes connected in series and connected in parallel with the low side capacitor switch string or the capacitor.

6. The charge and discharge signal circuit according to claim 1, wherein the switch element is a diode.

7. The charge and discharge signal circuit according to claim 6, wherein
   each of the high side drive circuits has a high side diode string including a plurality of diodes connected in series and connected in parallel with the high side capacitor switch string or the capacitor, and each of the low side drive circuits has a low side diode string including a plurality of diodes connected in series and connected in parallel with the low side capacitor switch string or the capacitor.

8. The charge and discharge signal circuit according to claim 1, wherein the switch element is a transistor to the gate of which an output of the high side drive part is applied, and which turns off when the high side transistor turns on, and which turns on when the high side transistor turns off.

9. The charge and discharge signal circuit according to claim 8, wherein
each of the high side drive circuits has a high side diode string including a plurality of diodes connected in series and connected in parallel with the high side capacitor switch string or the capacitor, and
each of the low side drive circuits has a low side diode string including a plurality of diodes connected in series and connected in parallel with the low side capacitor switch string or the capacitor.

10. The charge and discharge signal circuit according to claim 1, wherein
each of the high side drive circuits has a high side diode string including a plurality of diodes connected in series and connected in parallel with the high side capacitor switch string or the capacitor, and
each of the low side drive circuits has a low side diode string including a plurality of diodes connected in series and connected in parallel with the low side capacitor switch string or the capacitor.

11. The charge and discharge signal circuit according to claim 1, wherein
the high side transistor is a PMOS transistor, and
the low side transistor is an NMOS transistor.

12. The charge and discharge signal circuit according to claim 11, comprising:
a high side charge circuit configured to charge at all times the capacitor of the high side drive circuit connected to the high potential side power source;
a low side charge circuit configured to charge at all times the capacitor of the low side drive circuit connected to the low potential side power source;
at least one charge PMOS transistor connected between the connection node of the capacitor and the switch element of the high side capacitor switch string of the neighboring high side drive circuit and that of the other neighboring high side drive circuit, and to the gate of which, the output of the high side drive part on the side more distant from the high potential side power source of the neighboring high side drive circuit is applied; and
at least one charge NMOS transistor connected between the connection node of the capacitor and the switch element of the low side capacitor switch string of the neighboring low side drive circuit and that of the other neighboring low side drive circuit, and to the gate of which, the output of the low side drive part on the side more distant from the low potential side power source of the neighboring low side drive circuit is applied.

13. The charge and discharge signal circuit according to claim 12, comprising a power source voltage detection circuit configured to detect that the voltage of the high potential side power source is lower than a predetermined voltage, wherein
in the case where the voltage of the high potential side power source is lower than a predetermined voltage, the high side transistor connected to the high potential side power source, the low side transistor connected to the low potential side power source, the charge PMOS transistor connected to the high side drive circuit connected to the high potential side power source, and the charge NMOS transistor connected to the low side drive circuit connected to the low potential side power source are maintained in the on state.

14. The charge and discharge signal circuit according to claim 1, wherein
the high side transistor and the low side transistor are NMOS transistors.

15. The charge and discharge signal circuit according to claim 14, comprising:
a low side charge circuit configured to charge at all times the capacitor of the low side drive circuit connected to the low potential side power source; and
at least three charge NMOS transistors connected between the connection node of the capacitor and the switch element of the high side capacitor switch string of the neighboring high side drive circuit and/or of the low side capacitor switch string of the neighboring low side drive circuit and that of the high side capacitor switch string of the other neighboring high side drive circuit and/or of the low side capacitor switch string of the neighboring low side drive circuit, and to the gates of which, the output of the high side drive circuit on the side more distant from the low potential side power source of the neighboring high side drive circuit or the output of the low side drive part on the side more distant from the low potential side power source of the neighboring low side drive circuit is applied.

16. A DC-DC converter comprising:
a capacitor one terminal of which is connected to a ground;
an inductor one terminal of which is connected to the other terminal of the capacitor; and
a charge and discharge signal circuit configured to output an alternating-current signal to be applied to the other terminal of the inductor, wherein
the charge and discharge signal circuit comprising:
a plurality of high side transistors connected in series between a high potential side power source and an output node;
a plurality of low side transistors connected in series between a low potential side power source and the output node;
a plurality of high side drive circuits provided respectively in correspondence to the plurality of high side transistors;
a plurality of low side drive circuits provided respectively in correspondence to the plurality of low side transistors; and
a drive signal generation circuit configured to output a drive signal, wherein
each of the high side drive circuits includes:
a high side level shifter configured to convert a level of the drive signal;
a high side capacitor switch string of a capacitor and a switch element connected in series, being connected in parallel with the high side transistor; and
a high side drive part connected between a source of the high side transistor and a connection node of the capacitor and the switch element of the high side capacitor switch string, to which an output of the high side level shifter is supplied, and which outputs a drive signal to the high side transistor, and each of the low side drive circuits includes:
- a low side level shifter configured to convert a level of the drive signal;
- a low side capacitor switch string of a capacitor and a switch element connected in series, being connected in parallel with the low side transistor; and
- a low side drive part connected between a source of the low side transistor and a connection node of the capacitor and the switch element of the low side capacitor switch string, to which an output of the low side level shifter is supplied, and which outputs a drive signal to the low side transistor.

17. The DC-DC converter according to claim 16, wherein the drive signal generation circuit outputs a PWM signal.

* * * * *